(12) United States Patent
Goto

(10) Patent No.: US 11,538,907 B2
(45) Date of Patent: Dec. 27, 2022

(54) SEMICONDUCTOR MEMORY DEVICE AND METHOD OF MANUFACTURING THE SAME

(71) Applicant: Kioxia Corporation, Tokyo (JP)

(72) Inventor: Masakazu Goto, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 137 days.

(21) Appl. No.: 17/019,684

(22) Filed: Sep. 14, 2020

(65) Prior Publication Data
US 2021/0226013 A1    Jul. 22, 2021

(30) Foreign Application Priority Data
Jan. 22, 2020   (JP) .............................. JP2020-008477

(51) Int. Cl.
| H01L 27/00 | (2006.01) |
| H01L 29/10 | (2006.01) |
| H01L 27/1157 | (2017.01) |
| H01L 27/11565 | (2017.01) |
| H01L 27/11582 | (2017.01) |

(52) U.S. Cl.
CPC ...... H01L 29/1041 (2013.01); H01L 27/1157 (2013.01); H01L 27/11565 (2013.01); H01L 27/11582 (2013.01)

(58) Field of Classification Search
CPC ......... H01L 27/11582; H01L 27/11556; H01L 27/11565; H01L 27/11519; H01L 29/1041
See application file for complete search history.

(56) References Cited

U.S. PATENT DOCUMENTS

| 9,666,296 B1 | 5/2017 | Maejima |
| 2012/0112260 A1* | 5/2012 | Kim .................. H01L 27/11556 257/314 |
| 2017/0053986 A1 | 2/2017 | Liu et al. |

FOREIGN PATENT DOCUMENTS

| JP | 2017-157260 A | 9/2017 |
| TW | 201717361 A | 5/2017 |

OTHER PUBLICATIONS

A. Hokazono et al., "Steep Channel Profiles in n/pMOS Controlled by Boron-doped Si:C Layers for Continual Bulk-CMOS Scaling", IEDM, 2009; pp. 673-676.

* cited by examiner

Primary Examiner — Reema Patel
(74) Attorney, Agent, or Firm — Foley & Lardner LLP

(57) ABSTRACT

A semiconductor memory device includes first conducting layers and a first semiconductor layer opposed to the first conducting layers. If a concentration of the dopant in the first semiconductor layer is measured along an imaginary straight line, the concentration of the dopant has: a maximum value at a first point, a minimum value in a region closer to the first conducting layer than the first point at a second point; and a minimum value in a region farther from the first conducting layer than the first point at a third point. The second point is nearer to an end portion of the first semiconductor layer on the first conducting layer side than that on the opposite side. The third point is farther from the end portion on the first conducting layer side than that on the opposite side.

5 Claims, 26 Drawing Sheets

SEMICONDUCTOR MEMORY DEVICE AND METHOD OF MANUFACTURING THE SAME

CROSS-REFERENCE TO RELATED APPLICATIONS

This application is based upon and claims the benefit of Japanese Patent Application No. 2020-008477, filed on Jan. 22, 2020, the entire contents of which are incorporated herein by reference.

BACKGROUND

Field

Embodiments described herein relate to a semiconductor memory device a method of manufacturing the same.

Description of the Related Art

There has been known a semiconductor memory device that includes a substrate, a plurality of first conducting layers, a first semiconductor layer, and memory cells. The plurality of first conducting layers are arranged in a first direction that intersects with a surface of the substrate. The first semiconductor layer extends in the first direction, the first semiconductor layer is opposed to the plurality of first conducting layers in a second direction that intersects with the first direction. The memory cells are disposed at intersecting portions between the first conducting layers and the first semiconductor layer.

DETAILED DESCRIPTION

Figure 1:
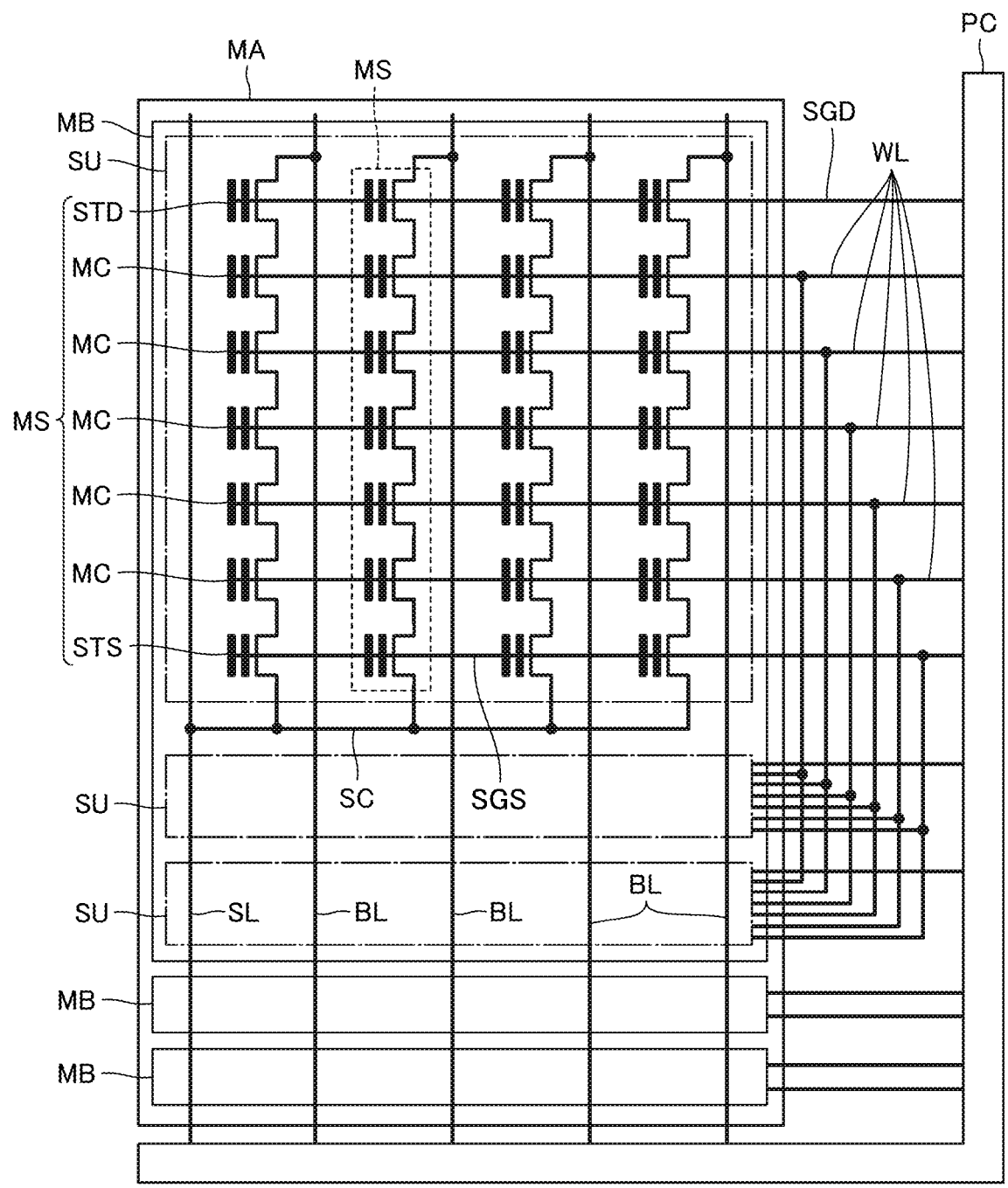
FIG. 1 is a schematic circuit diagram illustrating a configuration of a semiconductor memory device according to the first embodiment.

A semiconductor memory device according to one embodiment comprises: a substrate; a plurality of first conducting layers arranged in a first direction that intersects with a surface of the substrate; a first semiconductor layer extending in the first direction, the first semiconductor layer being opposed to the plurality of first conducting layers in a second direction that intersects with the first direction and containing a dopant; and memory cells disposed at intersecting portions between the first conducting layers and the first semiconductor layer, wherein the first semiconductor layer contains crystal grains of 100 nm or more in size, in a case where a concentration of the dopant in the first semiconductor layer is measured along an imaginary straight line that extends in the second direction, when a point on the imaginary straight line at which the concentration of the dopant has a maximum value is defined as a first point, a point on the imaginary straight line at which the concentration of the dopant has a minimum value in a region closer to the first conducting layer than the first point is defined as a second point, and a point on the imaginary straight line at which the concentration of the dopant has a minimum value in a region farther from the first conducting layer than the first point is defined as a third point, a distance from the second point to an end portion of the first semiconductor layer on the first conducting layer side is smaller than a distance from the second point to an end portion of the first semiconductor layer on an opposite side of the first conducting layer, and a distance from the third point to the end portion of the first semiconductor layer on the first conducting layer side is greater than a distance from the third point to the end portion of the first semiconductor layer on the opposite side of the first conducting layer.

A semiconductor memory device according to one embodiment comprises: a substrate; a plurality of first conducting layers arranged in a first direction that intersects with a surface of the substrate; a first semiconductor layer extending in the first direction, the first semiconductor layer being opposed to the plurality of first conducting layers in a second direction that intersects with the first direction and containing a dopant; and memory cells disposed at intersecting portions between the first conducting layers and the first semiconductor layer, wherein the first semiconductor layer contains crystal grains of 100 nm or more in size, in a case where a concentration of the dopant in the first semiconductor layer is measured along an imaginary straight line that extends in the second direction, when a point on the imaginary straight line at which the concentration of the dopant has a minimum value is defined as a first point, and a point on the imaginary straight line at which the concentration of the dopant has a maximum value in a region farther from the first conducting layer than the first point is defined as a second point, a distance from the second point to an end portion of the first semiconductor layer on the first conducting layer side is greater than a distance from the second point to an end portion of the first semiconductor layer on an opposite side of the first conducting layer.

A method for manufacturing a semiconductor memory device according to one embodiment comprises: forming a plurality of first layers arranged in a first direction that intersects with a surface of a substrate above the substrate; forming through-holes that penetrate the plurality of first layers and extend in the first direction; forming a gate insulating film on inner peripheral surfaces of the through-holes; forming a first semiconductor layer inside the through-holes, the first semiconductor layer being opposed to the inner peripheral surfaces of the through-holes via the gate insulating film; forming a second semiconductor layer inside the through-holes, the second semiconductor layer being opposed to the inner peripheral surfaces of the through-holes via the first semiconductor layer; and forming a third semiconductor layer inside the through-holes, the third semiconductor layer being opposed to the inner peripheral surfaces of the through-holes via the second semiconductor layer. The second semiconductor layer contains a dopant. Neither the first semiconductor layer nor the third semiconductor layer contains the dopant, or concentrations of the dopant in the first semiconductor layer and the third semiconductor layer are lower than a concentration of the dopant in the second semiconductor layer.

Next, the semiconductor memory devices according to the embodiments are described in detail with reference to the drawings. The following embodiments are only examples, and are not described for the purpose of limiting the present invention. The following drawings are schematic, and for sake of convenient description, a part of configurations is sometimes omitted.

Same reference numerals are attached to portions common between a plurality of embodiments, and their descriptions are omitted in some cases.

In this specification, when referring to the "semiconductor memory device", it may mean a memory die and may mean a memory system including a control die, such as a memory chip, a memory card, and an SSD. Further, it may mean a configuration including a host computer, such as a smartphone, a tablet terminal, and a personal computer.

In this specification, when referring to that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when referring to that the first configuration "is connected between" the second configuration and a third configuration, it may mean that the first configuration, the second configuration, and the third configuration are connected in series and the first configuration is disposed on a current path between the second configuration and the third configuration.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like turns ON.

The following describes the semiconductor memory devices according to the embodiments with reference to the drawings.

First Embodiment

Configuration

FIG. 1 is a schematic equivalent circuit diagram illustrating a configuration of a semiconductor memory device according to the first embodiment.

The semiconductor memory device according to the embodiment includes a memory cell array MA and a peripheral circuit PC that controls the memory cell array MA.

The memory cell array MA includes a plurality of memory blocks MB. These plurality of memory blocks MB each include a plurality of string units SU. These plurality of string units SU each include a plurality of memory strings MS. These plurality of memory strings MS have one ends each connected to the peripheral circuit PC via a bit line BL. These plurality of memory strings MS have other ends each connected to the peripheral circuit PC via a common source line SL.

The memory string MS includes a drain select transistor STD, a plurality of memory cells MC, and a source select transistor STS, which are connected in series between the bit line BL and the source line SL. Hereinafter, the drain select transistor STD and the source select transistor STS may be simply referred to as select transistors (STD, STS).

The memory cell MC is a field-effect type transistor (memory transistor) that includes a semiconductor layer, agate insulating film including an electric charge accumulating film, and a gate electrode. The semiconductor layer functions as a channel region. The memory cell MC has a threshold voltage that varies corresponding to an electric charge amount in the electric charge accumulating film. The respective gate electrodes of the plurality of memory cells MC corresponding to one memory string MS are connected to word lines WL. These respective word lines WL are commonly connected to all the memory strings MS in one memory block MB.

The select transistor (STD, STS) is a field-effect type transistor that includes a semiconductor layer, a gate insulating film, and a gate electrode. The semiconductor layer functions as a channel region. The respective gate electrodes of the select transistors (STD, STS) are connected to select gate lines (SGD, SGS). Drain select line SGD is disposed corresponding to the string unit SU and commonly connected to all the memory strings MS in one string unit SU.

Source select line SGS is commonly connected to all the memory strings MS in the plurality of string units SU.

The peripheral circuit PC includes an operating voltage generation circuit that generates operating voltages, an address decoder that decodes address data, a voltage transfer circuit that transfers the operating voltage to the memory cell array MA corresponding to an output signal of the address decoder, a sense amplifier that detects currents or voltages of the bit lines BL, and a sequencer that controls them.

Figure 2:
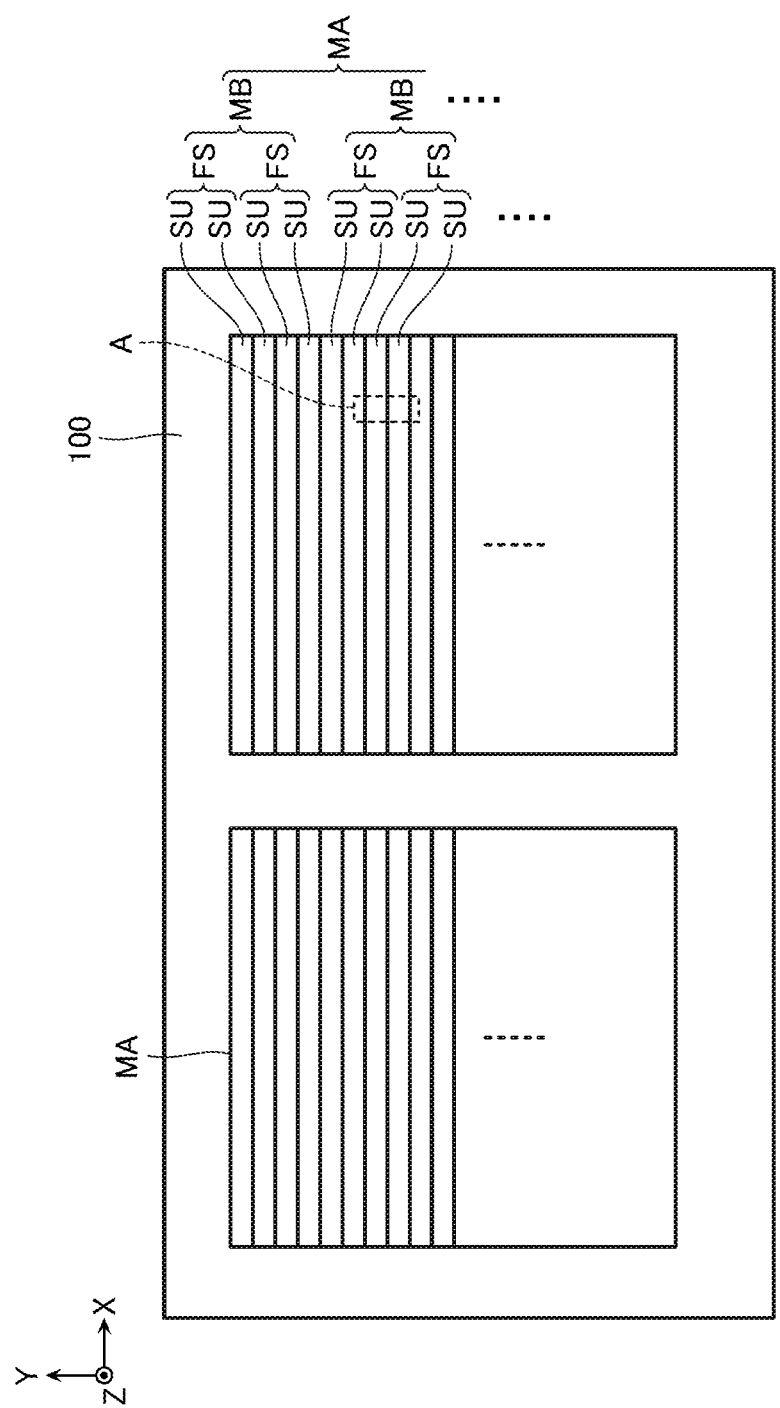
FIG. 2 is a schematic plan view illustrating the configuration of the semiconductor memory device.

FIG. 2 is a schematic plan view illustrating the semiconductor memory device according to the embodiment. As illustrated in FIG. 2 the semiconductor memory device according to the embodiment includes a semiconductor substrate 100. In the illustrated example, the semiconductor substrate 100 includes two memory cell arrays MA arranged in an X-direction. The memory cell array MA includes a plurality of memory blocks MB arranged in a Y-direction. The memory block MB includes two finger structures FS arranged in the Y-direction. The finger structure FS includes two string units SU arranged in the Y-direction.

Figure 3:
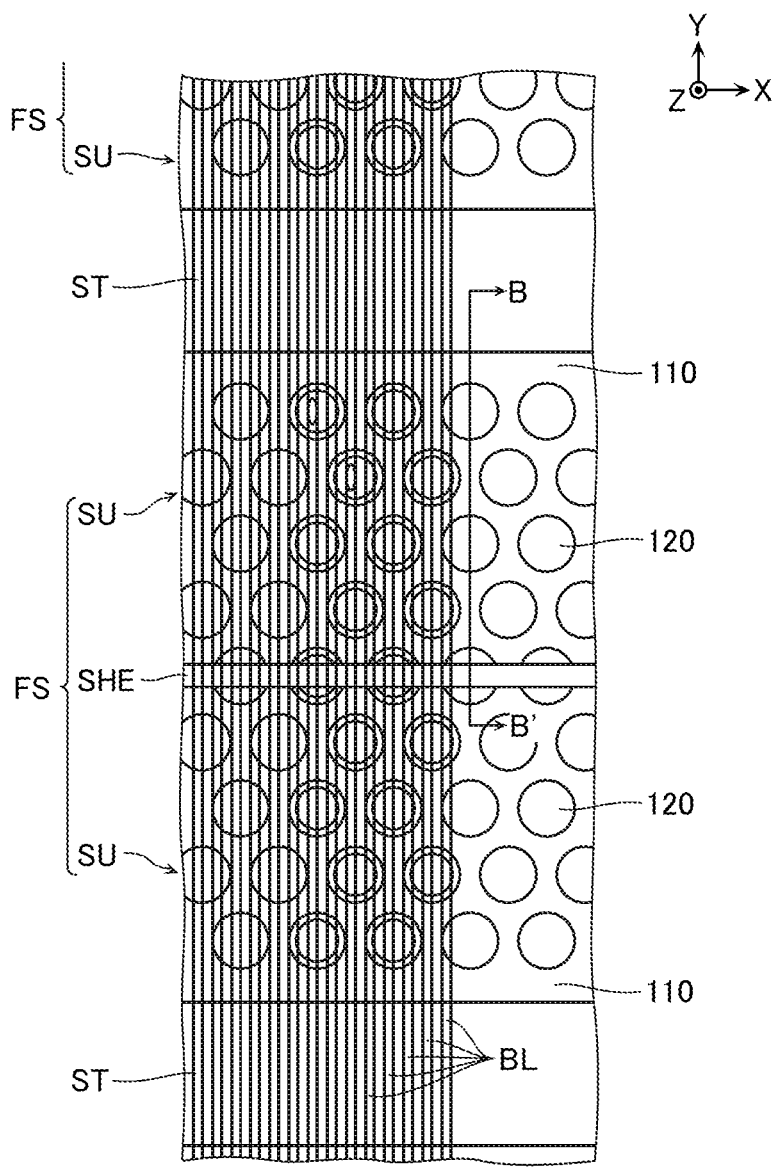
FIG. 3 is an enlarged view of a part indicated by A in FIG. 2.

FIG. 3 is a schematic enlarged view of a part indicated by A in FIG. 2. As illustrated in FIG. 3, an inter-block structure insulating layer ST extending in the X-direction is disposed between the two finger structures FS arranged in the Y-direction. The finger structure FS includes a conducting layer 110 that extends in the X-direction and a plurality of semiconductor layers 120 arranged in a predetermined pattern in the X-direction and the Y-direction. Between the two string units SU arranged in the Y-direction, an inter-sub-block insulating layer SHE that extends in the X-direction is disposed. FIG. 3 illustrates the plurality of bit lines BL that are arranged in the X-direction and extend in the Y-direction. These plurality of bit lines BL are each connected to one semiconductor layer 120 included in each of the string units SU.

Figure 4:
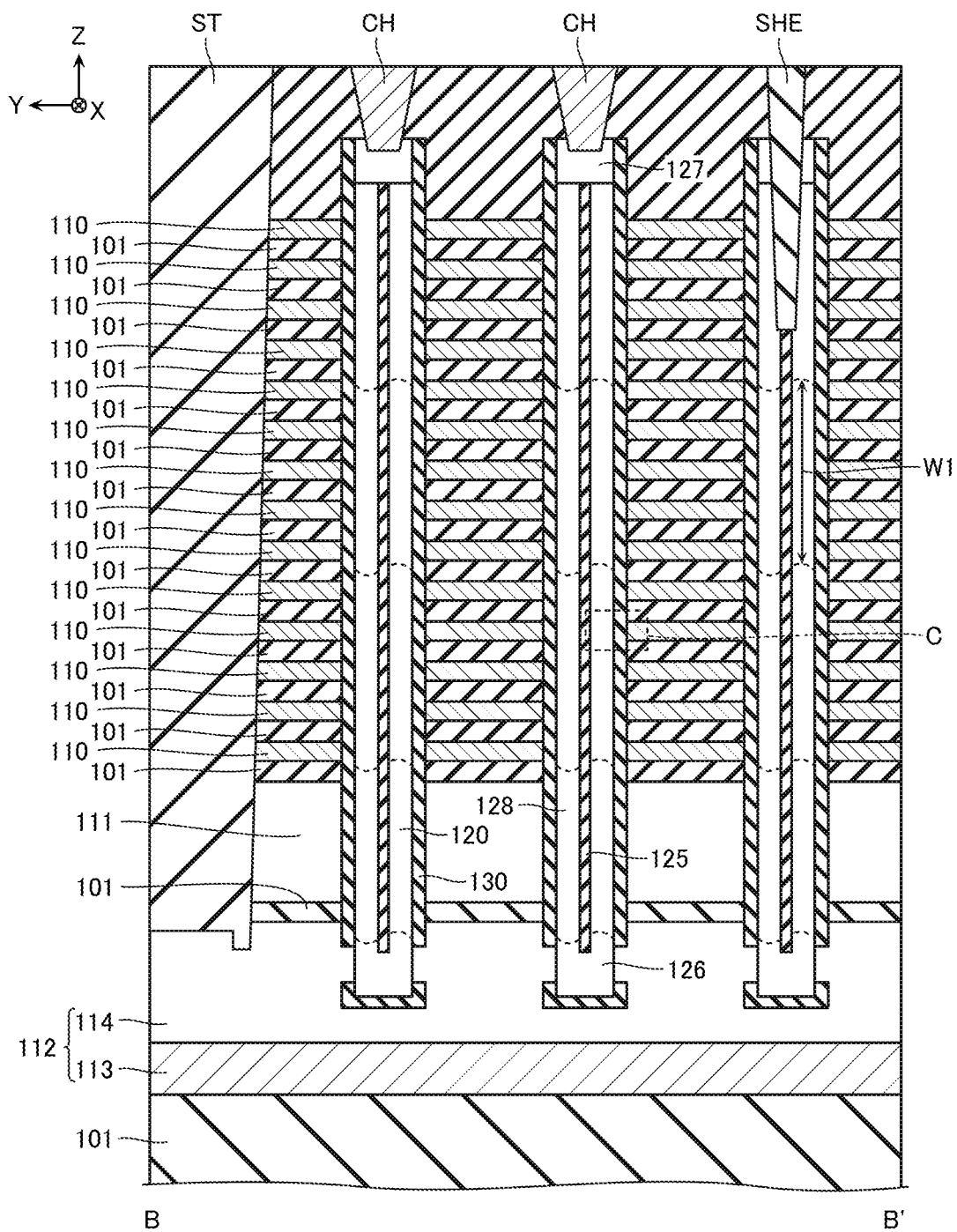
FIG. 4 is a cross-sectional view of a structure illustrated in FIG. 3 taken along a line B-B' viewed in an arrow direction.
Figure 5:
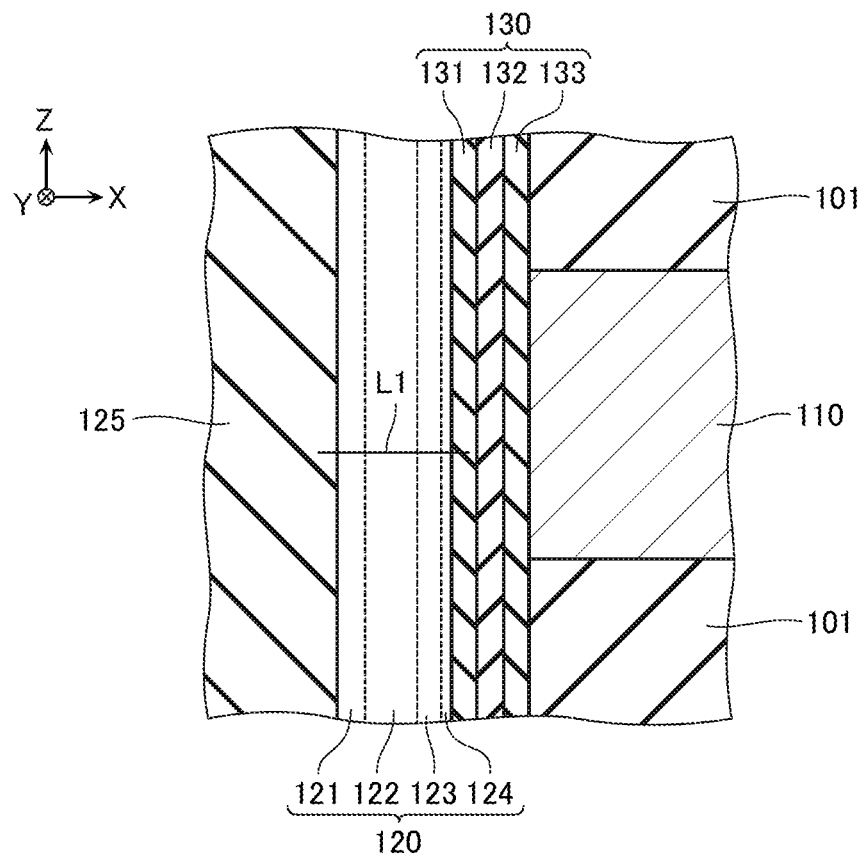
FIG. 5 is an enlarged view of a part indicated by C in FIG. 4.

FIG. 4 is a schematic cross-sectional view taken along a line B-B' of the structure illustrated in FIG. 3 viewed in an arrow direction. FIG. 5 is a schematic enlarged view of a part indicated by C of FIG. 4.

As illustrated in FIG. 4, the string unit SU includes a plurality of the conducting layers 110 arranged in a Z-direction, the plurality of semiconductor layers 120 that extend in the Z-direction, and a plurality of gate insulating films 130 each disposed between the plurality of conducting layers 110 and the plurality of semiconductor layers 120.

The conducting layer 110 functions as the gate electrode, the word line WL, and the like of, for example, the memory cell MC. The conducting layer 110 is an approximately plate-shaped conducting layer extending in the X-direction. The conducting layer 110, for example, may include a laminated film or the like of titanium nitride (TiN) and tungsten (W) or may include polycrystalline silicon or the like containing impurities such as phosphorus (P) or boron (B). Between the plurality of conducting layers 110 arranged in the Z-direction, insulating layers 101 of silicon oxide ($SiO_2$) or the like are disposed.

Under the conducting layer 110, a conducting layer 111 is disposed. The conducting layer 111 functions as the gate electrode of the source select transistor STS and the source select line SGS. The conducting layer 111 may, for example, include polycrystalline silicon or the like containing impurities such as phosphorus (P). Between the conducting layer 111 and the conducting layer 110, the insulating layer 101 of silicon oxide ($SiO_2$) or the like is disposed.

Under the conducting layer 111, a conducting layer 112 is disposed. The conducting layer 112 functions as the source line SL. The conducting layer 112 may, for example, include a conducting layer 113 containing metal such as tungsten silicide (WSi) and a conducting layer 114 of polycrystalline silicon or the like containing N-type impurities such as phosphorus (P). Between the conducting layer 112 and the conducting layer 111, the insulating layer 101 of the silicon oxide ($SiO_2$) or the like is disposed.

The semiconductor layer 120 functions as a channel region of the plurality of memory cells MC and the select transistors (STD, STS) included in one memory string MS (FIG. 1). The semiconductor layer 120 is, for example, a semiconductor layer of polycrystalline silicon (Si) or the like. The semiconductor layer 120 has, for example, an approximately closed-bottomed cylindrical shape and includes an insulating layer 125 of silicon oxide or the like at a center part. Respective outer peripheral surfaces of the semiconductor layers 120 are surrounded by the conducting layers 110.

The semiconductor layer 120 contains, for example, crystal grains of 100 nm or more in size. Here, the size of the crystal grain means the maximum width of the crystal grain when the width of the crystal grain is measured from a plurality of directions on a cross-sectional surface observed with an electron microscope and the like. For example, in the illustrated example, the semiconductor layer 120 contains the crystal grains having sizes W1 in the Z-direction of 100 nm or more.

The semiconductor layer 120 has a lower end portion and an upper end portion on which impurity regions 126 and 127 containing N-type impurities such as phosphorus (P) are disposed. Between the impurity regions 126 and 127, a region 128 that does not contain N-type impurities such as phosphorus (P) is disposed. The impurity region 126 is connected to the conducting layer 114 and is opposed to the conducting layer 111. The impurity region 127 is connected to the bit line BL (FIG. 3) via the contact CH. The region 128 is opposed to the conducting layer 111 and all the conducting layers 110 arranged in the Z-direction.

The gate insulating film 130 has a shape of an approximately closed-bottomed cylindrical shape that covers an outer peripheral surface and a lower end of the semiconductor layer 120. However, the gate insulating film 130 is not disposed in a connecting portion between the semiconductor layer 120 and the conducting layer 114.

The gate insulating film 130 includes, for example, as illustrated in FIG. 5, a tunnel insulating film 131, an electric charge accumulating film 132, and a block insulating film 133, which are laminated between the semiconductor layer 120 and the conducting layer 110. The tunnel insulating film 131 and the block insulating film 133 are, for example, insulating films such as silicon oxide ($SiO_2$) or the like. The electric charge accumulating film 132 is, for example, a film configured to accumulate the electric charge of silicon nitride ($Si_3N_4$) or the like. The tunnel insulating film 131, the electric charge accumulating film 132, and the block insulating film 133, which have approximately cylindrical shapes, extend in the Z-direction along the outer peripheral surface of the semiconductor layer 120.

FIG. 5 illustrates an example in which the gate insulating film 130 includes the electric charge accumulating film 132 of silicon nitride or the like. However, the gate insulating film 130 may, for example, include a floating gate of polycrystalline silicon or the like containing N-type or P-type impurities.

Next, the concentration of the dopant contained in the semiconductor layer 120 will be described with reference to FIG. 5 and FIG. 6.

Note that the dopant here is any of carbon (C), oxygen (O), nitrogen (N), or boron (B).

Figure 6:
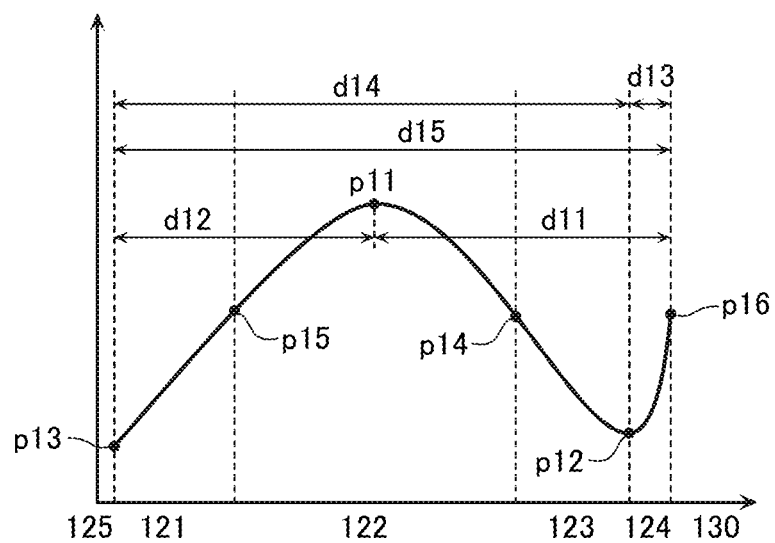
FIG. 6 is a schematic graph illustrating a concentration distribution of a dopant obtained when measuring the concentration of the dopant along an imaginary straight line L1 illustrated in FIG. 5.

FIG. 6 is a schematic graph illustrating a concentration distribution of the dopant obtained when an imaginary straight line L1 is set to a cross-sectional surface as illustrated in FIG. 5 and the concentration of the dopant is measured along the imaginary straight line L1. The imaginary straight line L1 is a straight line, for example, connecting between a part of the insulating layer 125 and a part of the gate insulating film 130. The straight line L1 extends in a direction intersecting with the Z-direction, for example, the X-direction or the Y-direction. The concentration distribution can be measured by, for example, irradiating the cross-sectional surface as illustrated in FIG. 5 with an electron beam and the like along the straight line L1, breaking a part of the semiconductor layer 120 along the electron beam, and analyzing a composition of the broken part.

FIG. 6 exemplifies a plurality of points p11 to p16 set on the imaginary straight line L1.

The point p11 indicates a point at which the concentration of the dopant has the maximum value. In the illustrated example, a distance d11 from the point p11 to an end portion of the semiconductor layer 120 on the gate insulating film 130 side is greater than a distance d12 from the point p11 to an end portion of the semiconductor layer 120 on the insulating layer 125 side.

The point p12 indicates a point at which the concentration of the dopant has the minimum value in a region closer to the gate insulating film 130 than the point p11. In the illustrated example, the concentration of the dopant monotonously decreases from the point p11 to the point p12. In the illustrated example, a distance d13 from the point p12 to the end portion of the semiconductor layer 120 on the gate insulating film 130 side is smaller than a distance d14 from the point p12 to the end portion of the semiconductor layer 120 on the insulating layer 125 side.

The point p13 indicates a point at which the concentration of the dopant has the minimum value in a region closer to the insulating layer 125 than the point p11. In the illustrated example, the concentration of the dopant monotonously increases from the point p13 to the point p11. In the illustrated example, a distance d15 from the point p13 to the end portion of the semiconductor layer 120 on the gate insulating film 130 side is larger than a distance from the point p13 to the end portion of the semiconductor layer 120 on the insulating layer 125 side. For example, in the illustrated example, the point p13 is positioned at the end portion of the semiconductor layer 120 on the insulating layer 125 side.

The point p14 indicates a point among the points between the point p11 and the point p12 at which the concentration of the dopant has an intermediate value between the concentration at the point p11 and the concentration at the point p12. When there are a plurality of points between the point p11 and the point p12 at which the concentration of the dopant has the intermediate value between the concentration at the point p11 and the concentration at the point p12, for example, a point closest to the point p11 among the plurality of points may be specified as the point p14.

The point p15 indicates a point among the points between the point p11 and the point p13 at which the concentration of the dopant has an intermediate value between the concentration at the point p11 and the concentration at the point p13. When there are a plurality of points between the point p11 and the point p13 at which the concentration of the dopant has the intermediate value between the concentration at the point p11 and the concentration at the point p13, for example, a point closest to the point p11 among the plurality of points may be specified as the point p15.

The point p16 indicates a point at which the concentration of the dopant has the maximum value in a region closer to the gate insulating film 130 than the point p12. In the illustrated example, the concentration of the dopant monotonously increases from the point p12 to the point p16. In the illustrated example, the point p16 is positioned at the end portion of the semiconductor layer 120 on the gate insulating film 130 side.

In the illustrated example, the semiconductor layer 120 is illustrated by dividing into four regions of a region 121, a region 122, a region 123, and a region 124 from the insulating layer 125 side to the gate insulating film 130 side. The region 121 is a region from the end portion of the semiconductor layer 120 on the insulating layer 125 side to the point p15. The region 122 is a region from the point p15 to the point p14. The region 123 is a region from the point p14 to the point p12. The region 124 is a region from the point p12 to the end portion of the semiconductor layer 120 on the gate insulating film 130 side.

In the illustrated example, the concentration of the dopant in the region 122 has an average value greater than average values of the concentration of the dopant in the regions 121, 123, and 124. The average values of the concentration of the dopant in the respective regions are calculated based on, for example, the concentration distribution of the dopant obtained along the straight line L1.

Manufacturing Method

Next, the method for manufacturing the semiconductor memory device according to the embodiment will be described with reference to FIG. 7 to FIG. 19. FIG. 7 to FIG. 19 are schematic cross-sectional views for describing the manufacturing method.

Figure 7:
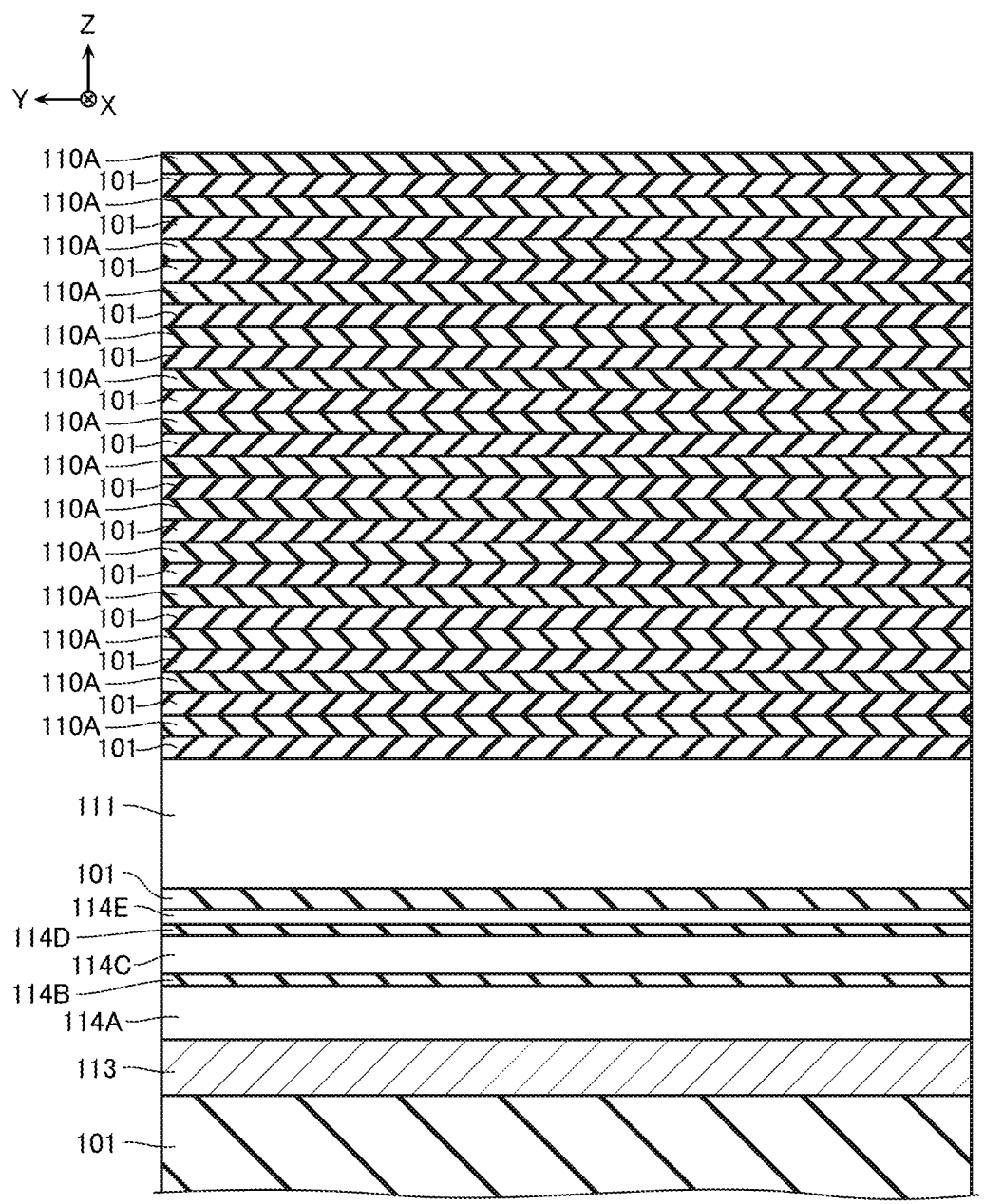
FIG. 7 is a schematic cross-sectional view illustrating a method for manufacturing the semiconductor memory device according to the first embodiment.

In the manufacturing method, for example, as illustrated in FIG. 7, the conducting layer 113, a semiconductor layer 114A of silicon or the like, a sacrificial layer 114B of silicon oxide or the like, a sacrificial layer 114C of silicon or the like, a sacrificial layer 114D of silicon oxide or the like, a semiconductor layer 114E of silicon or the like, the insulating layer 101, and the conducting layer 111 are formed on the insulating layer 101. The plurality of insulating layers 101 and a plurality of sacrificial layers 110A are alternately formed. This process is, for example, performed by a method such as Chemical Vapor Deposition (CVD).

Figure 8:
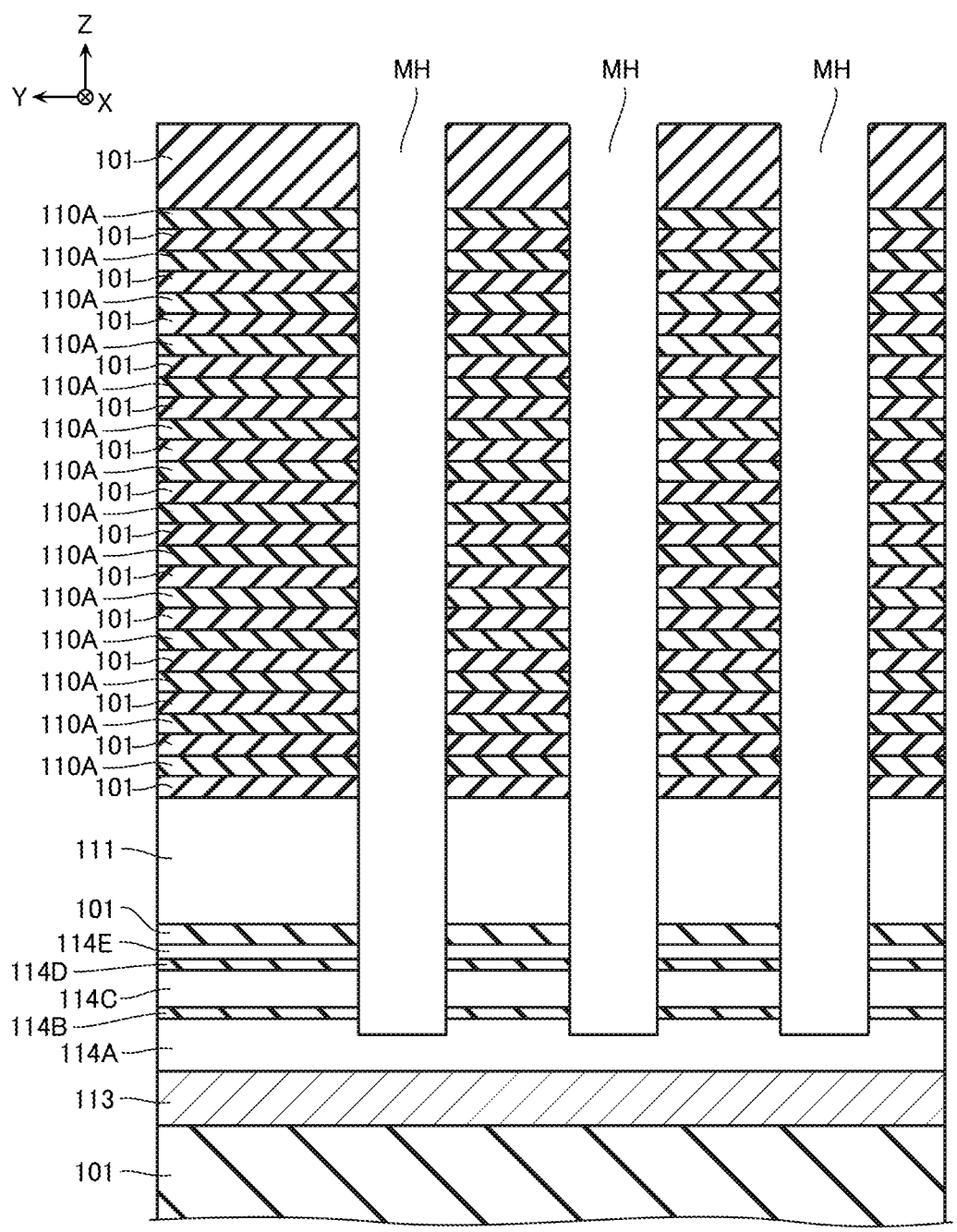
FIG. 8 is a schematic cross-sectional view illustrating the manufacturing method.

Next, for example, as illustrated in FIG. 8, openings MH are formed. The openings MH pass through the plurality of insulating layers 101 and the plurality of sacrificial layers 110A, the conducting layer 111, the semiconductor layer 114E, the sacrificial layer 114D, the sacrificial layer 114C, and the sacrificial layer 114B to extend in the Z-direction. This process is, for example, performed by a method such as Reactive Ion Etching (RIE).

Figure 9:
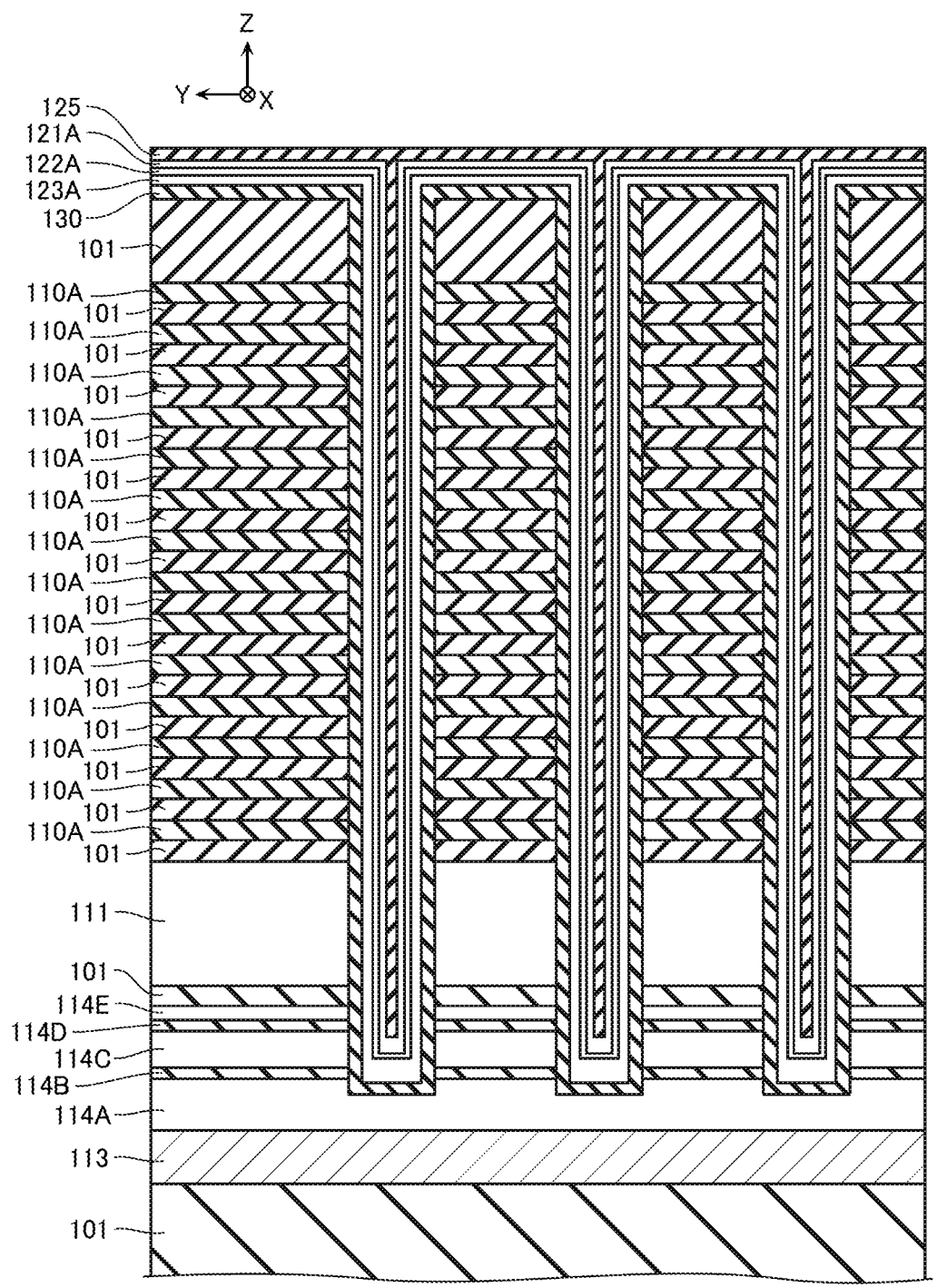
FIG. 9 is a schematic cross-sectional view illustrating the manufacturing method.

Next, for example, as illustrated in FIG. 9, the gate insulating film 130, semiconductor layers 123A, 122A, and 121A of silicon or the like, and the insulating layer 125 are formed inside the openings MH and on the upper surface of the insulating layer 101 positioned in the uppermost layer among the plurality of insulating layers 101 (hereinafter referred to as the "insulating layer 101 positioned in the uppermost layer"). The semiconductor layer 122A contains the above-described dopant. The semiconductor layers 123A and 121A may contain the above-described dopant, or do not need to contain the dopant. When the semiconductor layers 123A and 121A contain the dopant, the concentrations of the dopant contained in the semiconductor layers 123A and 121A are lower than the concentration of the dopant contained in the semiconductor layer 122A. This process is performed by a method such as CVD. Any of the above-described dopants may be added to the surface of the gate insulating film 130 between the formation of the gate insulating film 130 and the formation of the semiconductor layer 123A.

Figure 10:
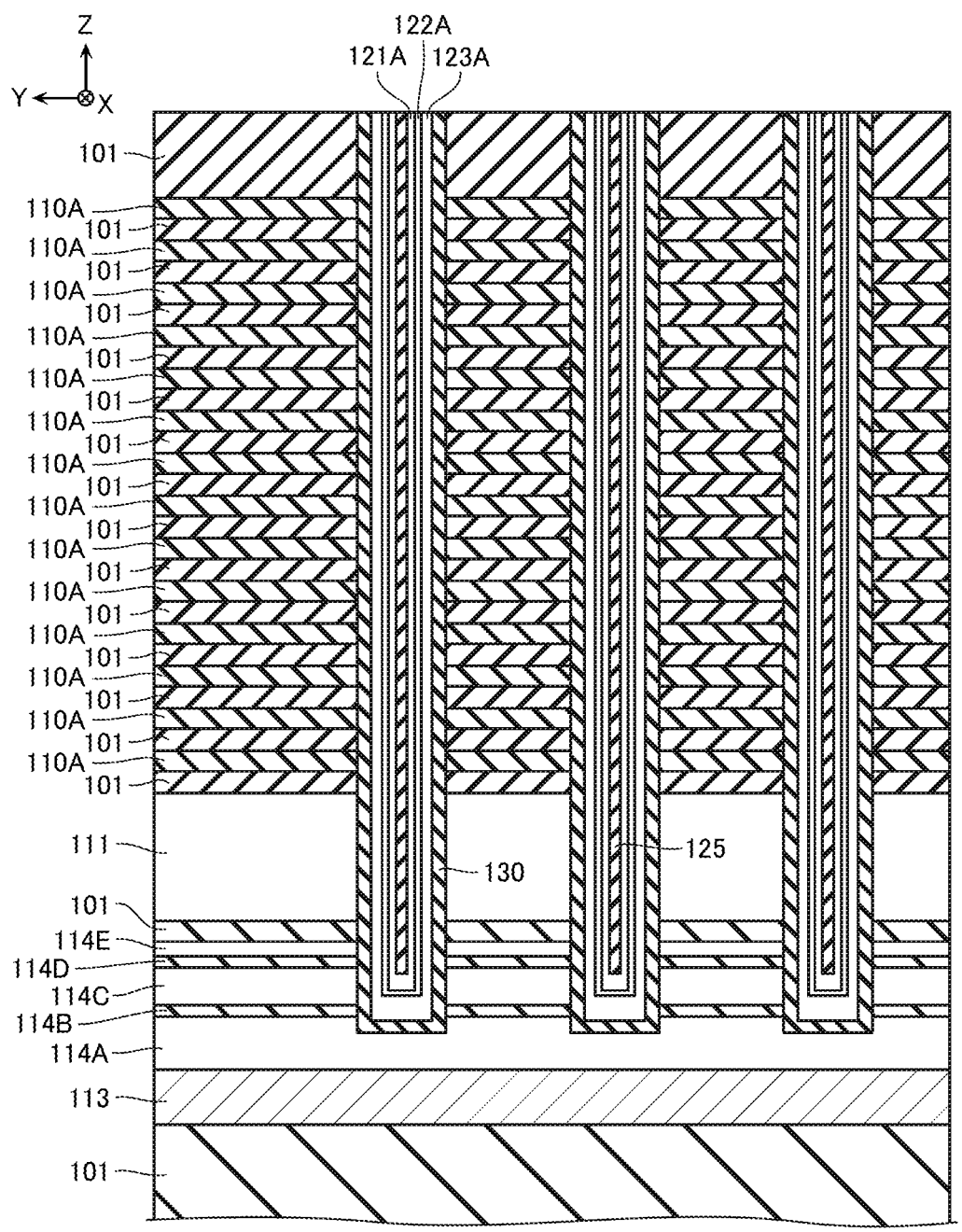
FIG. 10 is a schematic cross-sectional view illustrating the manufacturing method.

Next, for example, as illustrated in FIG. 10, for the gate insulating film 130, the semiconductor layers 123A, 122A, and 121A of silicon or the like, and the insulating layer 125, the part disposed on the upper surface of the insulating layer 101 positioned in the uppermost layer is removed. This process is performed by a method such as an etchback by the RIE.

Figure 11:
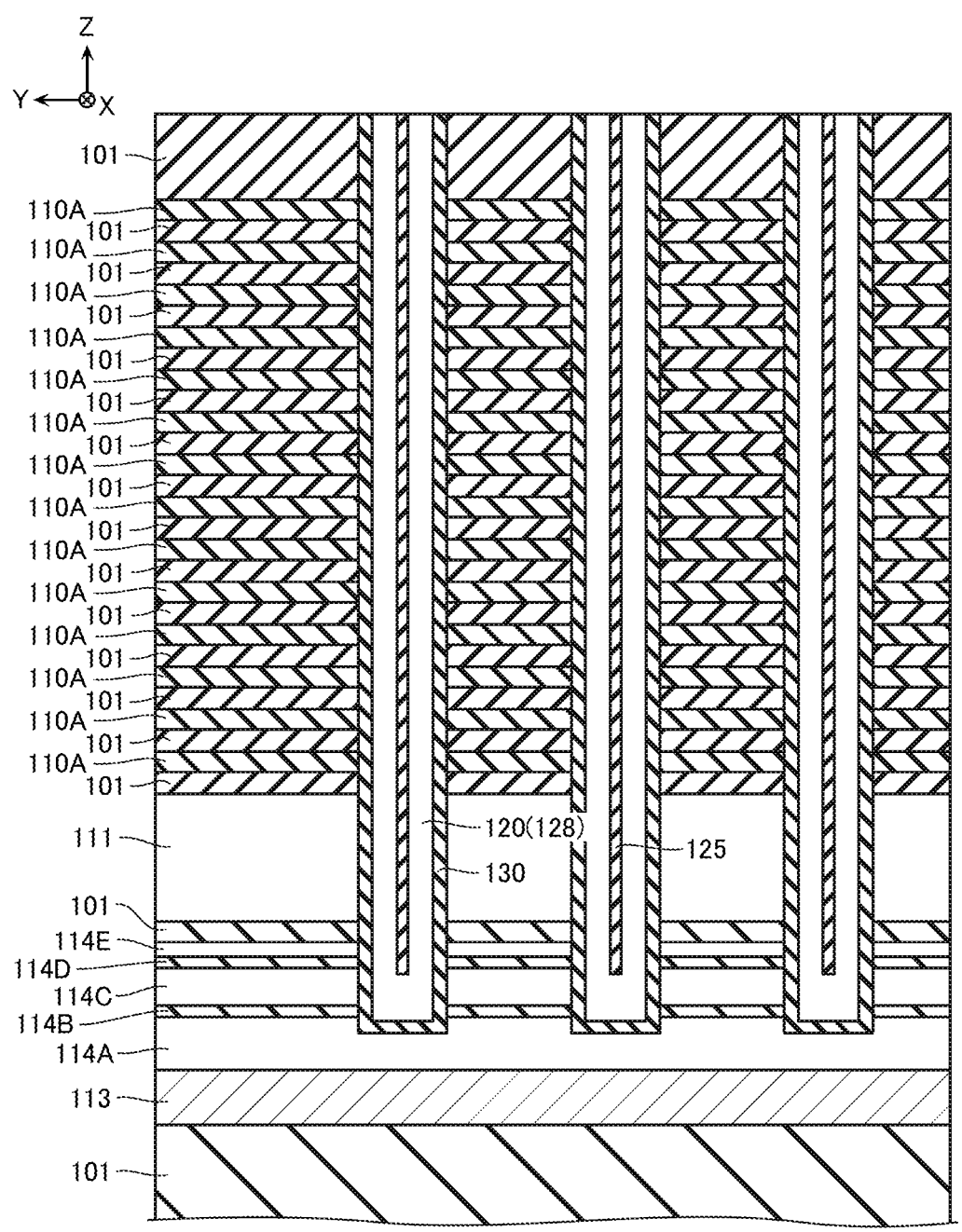
FIG. 11 is a schematic cross-sectional view illustrating the manufacturing method.

Next, for example, as illustrated in FIG. 11, crystalline structures of the semiconductor layers 123A, 122A, and 121A are modified by a method such as a heat treatment. Thus, the region 128 of the semiconductor layer 120 is formed.

Figure 12:
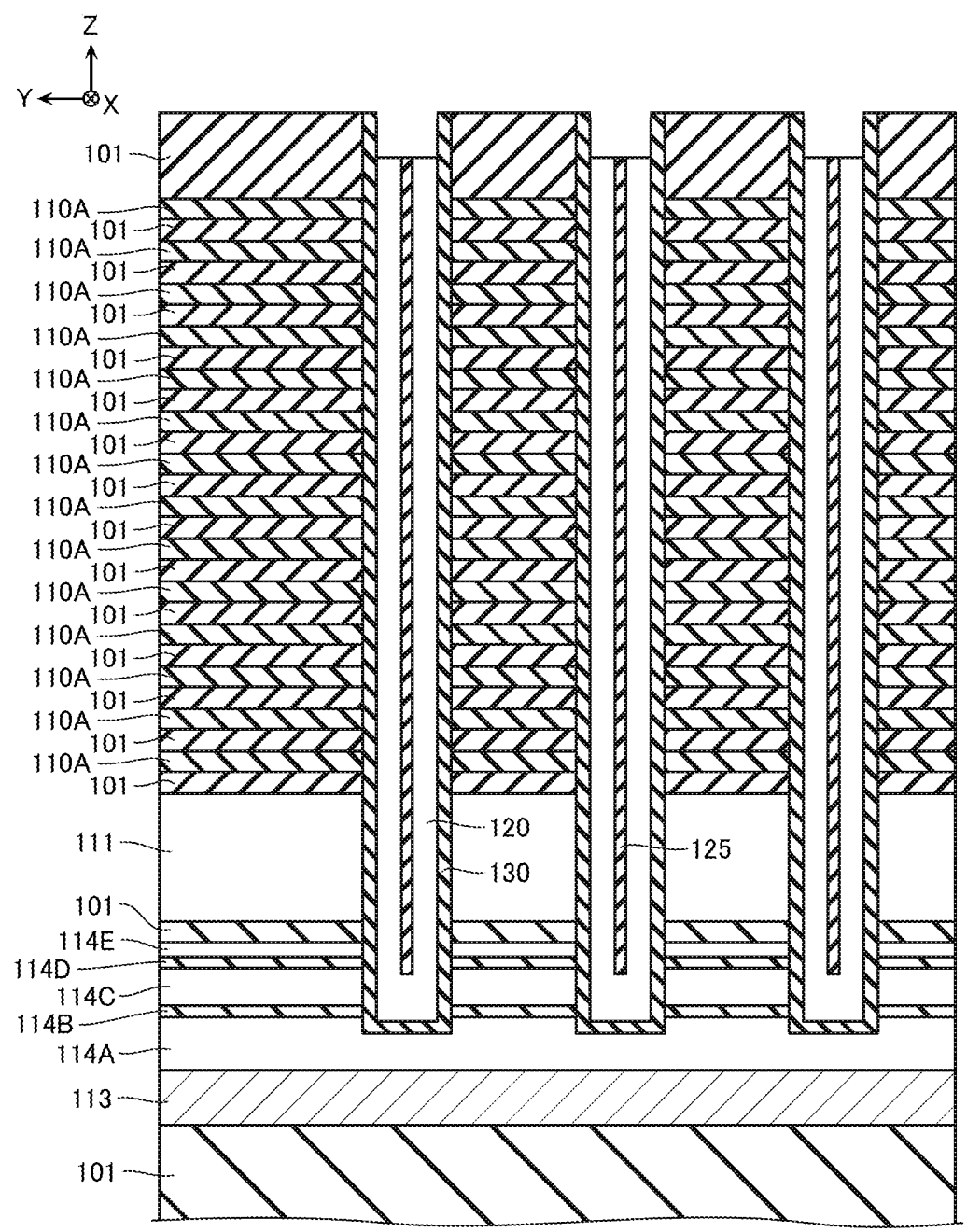
FIG. 12 is a schematic cross-sectional view illustrating the manufacturing method.

Next, for example, as illustrated in FIG. 12, the semiconductor layer 120 and the insulating layer 125 are partially removed. This process is performed, for example, so as to position the upper ends of the semiconductor layer 120 and the insulating layer 125 between the upper surface and the lower surface of the insulating layer 101 positioned in the uppermost layer. This process is performed by a method such as RIE.

Figure 13:
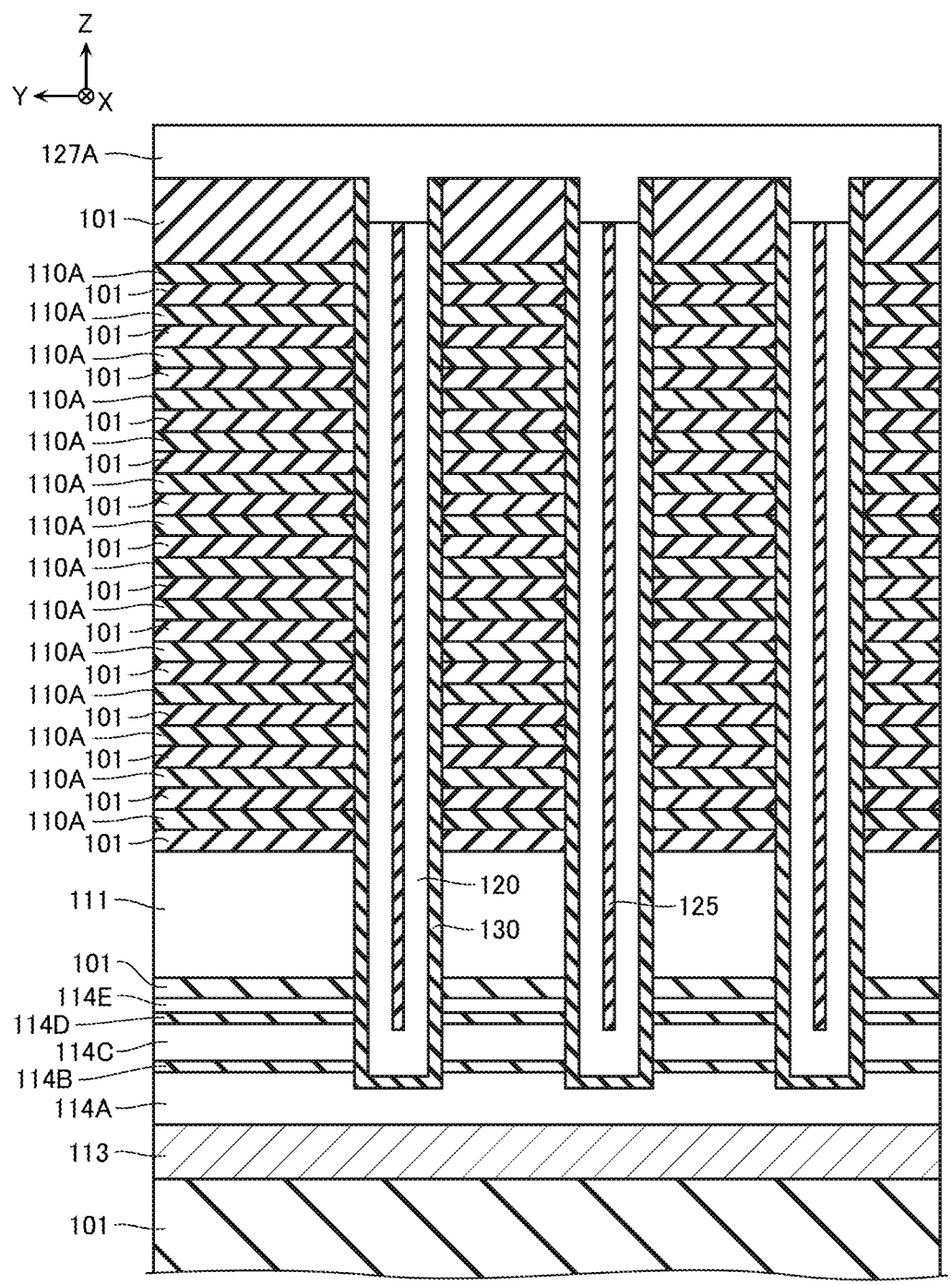
FIG. 13 is a schematic cross-sectional view illustrating the manufacturing method.

Next, for example, as illustrated in FIG. 13, a semiconductor layer 127A of silicon or the like containing impurities such as phosphorus is formed at the upper ends of the semiconductor layer 120 and the insulating layer 125 and on the upper surface of the insulating layer 101 positioned in the uppermost layer. This process is performed by a method such as CVD.

Figure 14:
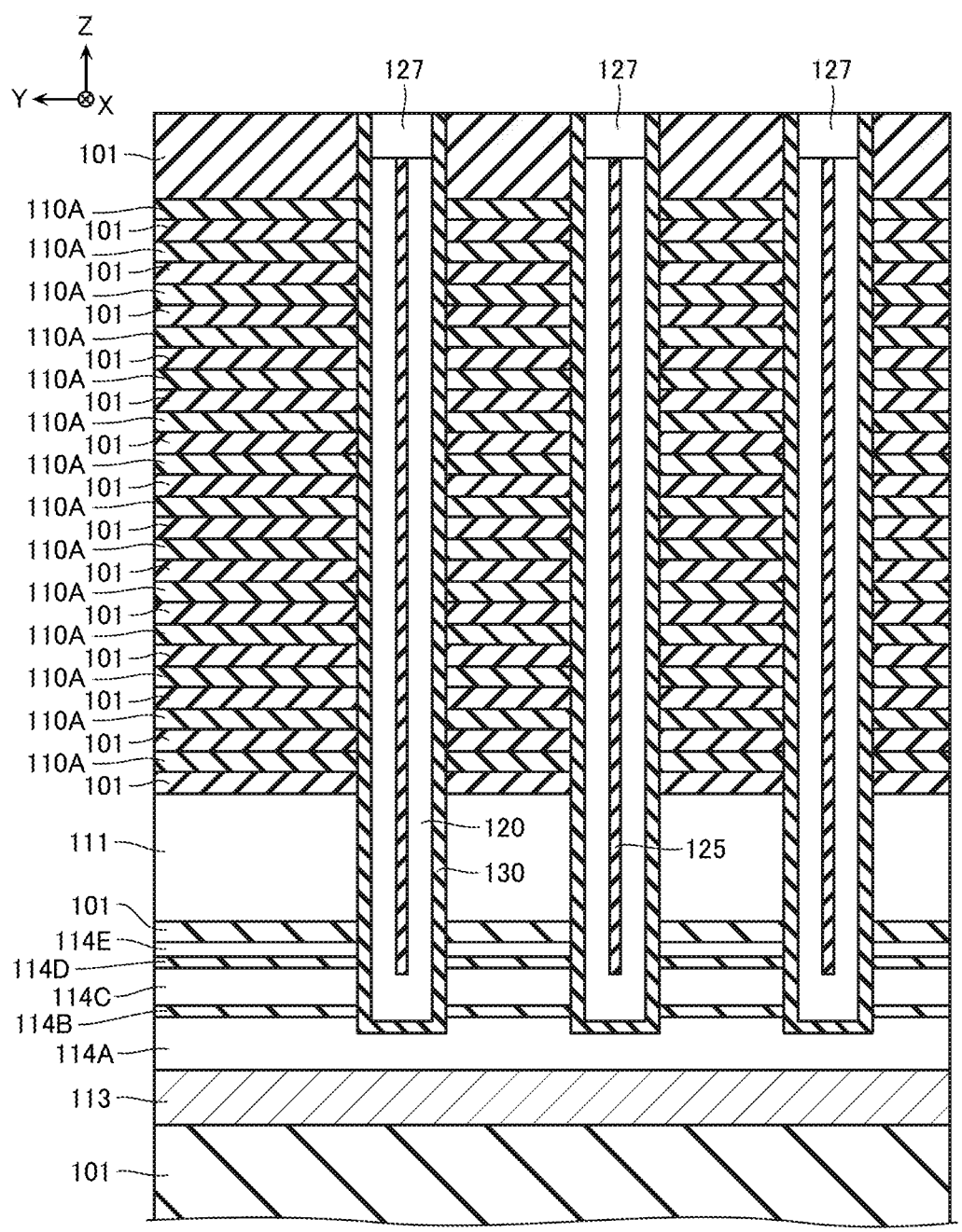
FIG. 14 is a schematic cross-sectional view illustrating the manufacturing method.

Next, for example, as illustrated in FIG. 14, for the semiconductor layer 127A, the part disposed on the upper surface of the insulating layer 101 positioned in the uppermost layer is removed. Thus, the impurity region 127 of the semiconductor layer 120 is formed. This process is performed by a method such as RIE.

Figure 15:
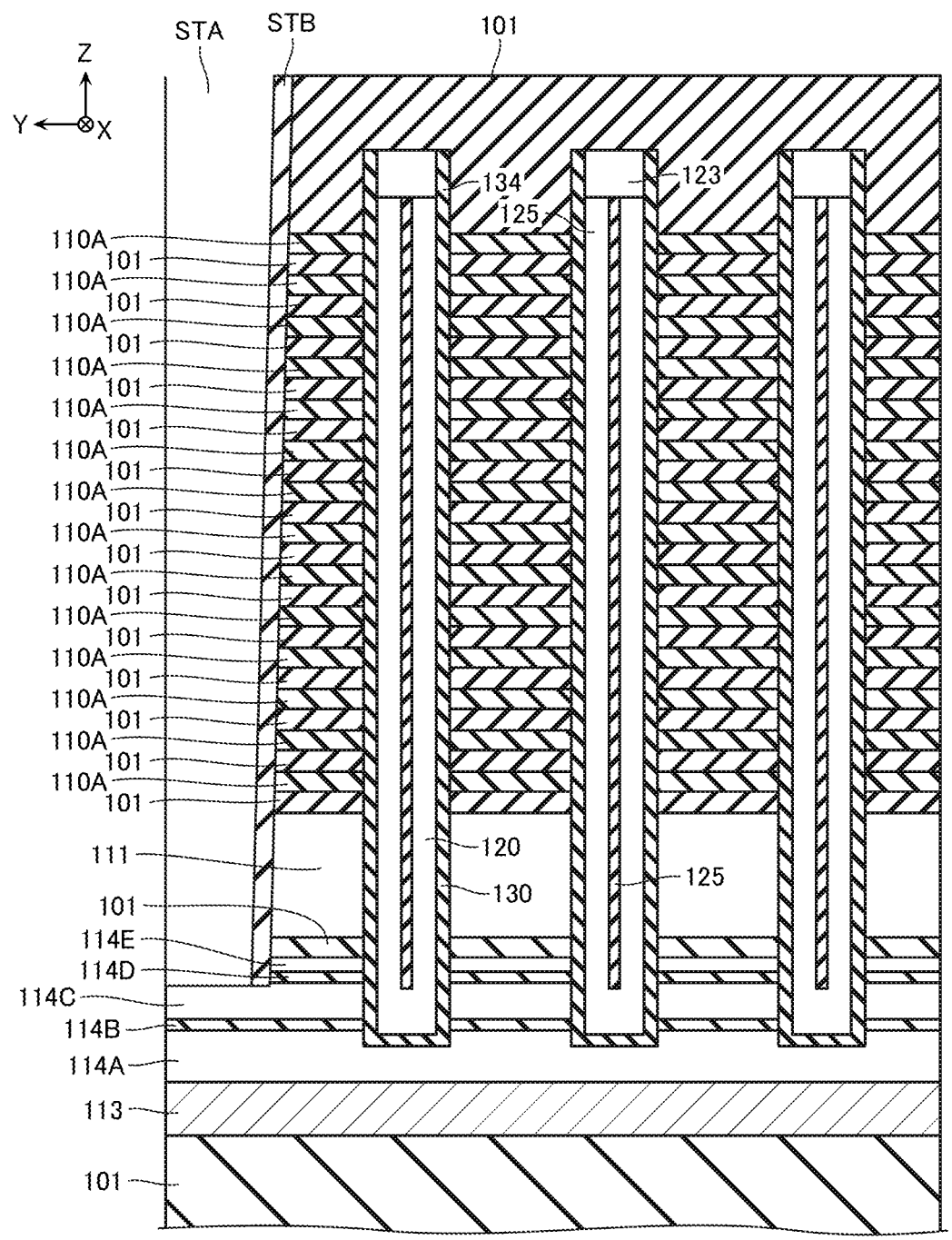
FIG. 15 is a schematic cross-sectional view illustrating the manufacturing method.

Next, for example, as illustrated in FIG. 15, an insulating layer 101 of silicon oxide or the like is formed on the upper surfaces of the semiconductor layer 120 and the insulating layer 101 positioned in the uppermost layer. This process is performed by a method such as CVD.

Next, for example, as illustrated in FIG. 15, an opening STA is formed. The opening STA passes through the plurality of insulating layers 101 and the plurality of sacrificial layers 110A, the conducting layer 111, the semiconductor layer 114E, and the sacrificial layer 114D, and extends in the X-direction and the Z-direction. This process is performed by a method such as RIE.

Next, for example, as illustrated in FIG. 15, a protective coat STB of silicon nitride or the like is formed on the side surface in the Y-direction of the opening STA. This process is performed by a method such as CVD.

Figure 16:
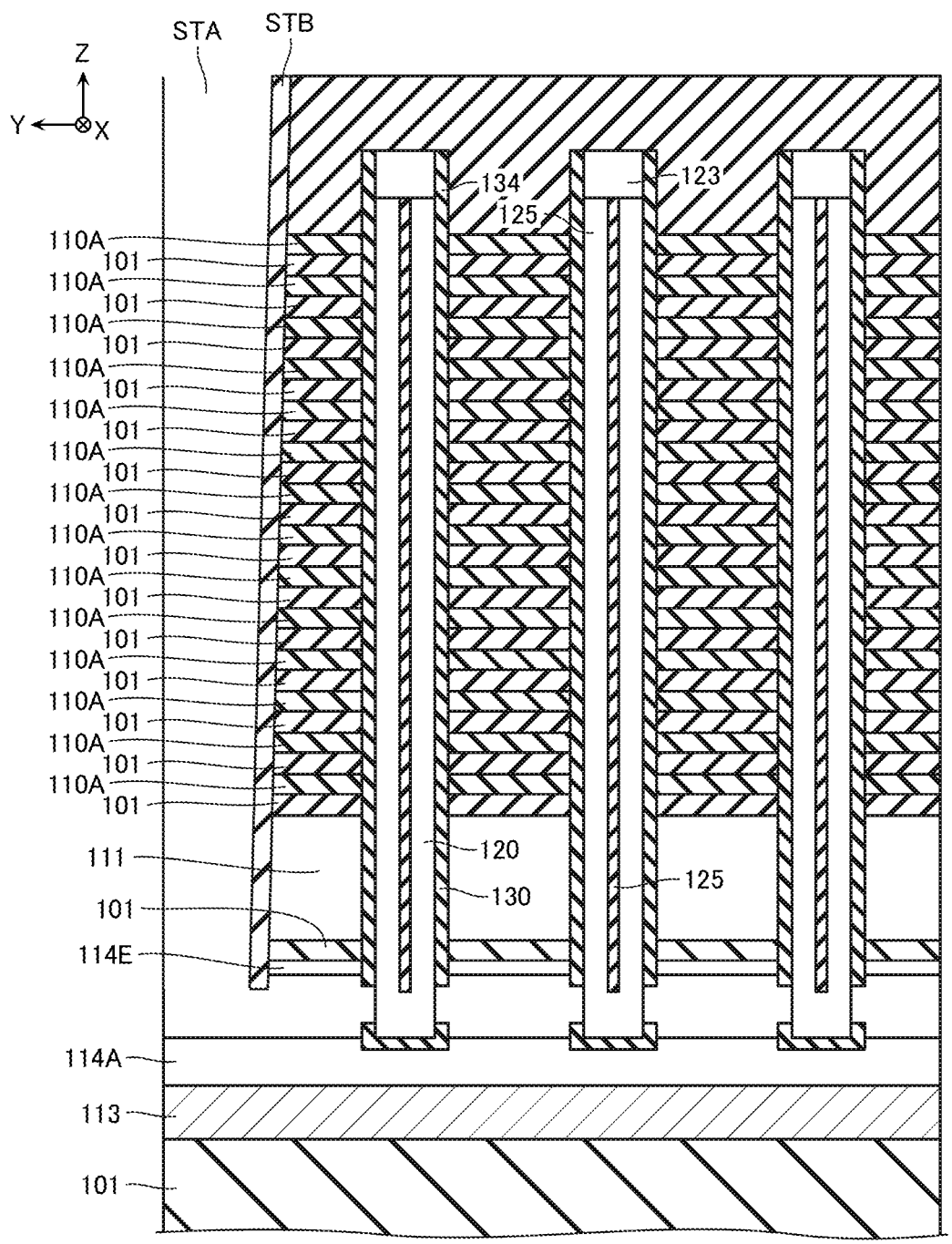
FIG. 16 is a schematic cross-sectional view illustrating the manufacturing method.

Next, for example, as illustrated in FIG. 16, the sacrificial layer 114C is removed. This process is performed by a method such as wet etching.

Next, for example, as illustrated in FIG. 16, the sacrificial layer 114B and the sacrificial layer 114D are removed. This process is performed by a method such as wet etching.

Figure 17:
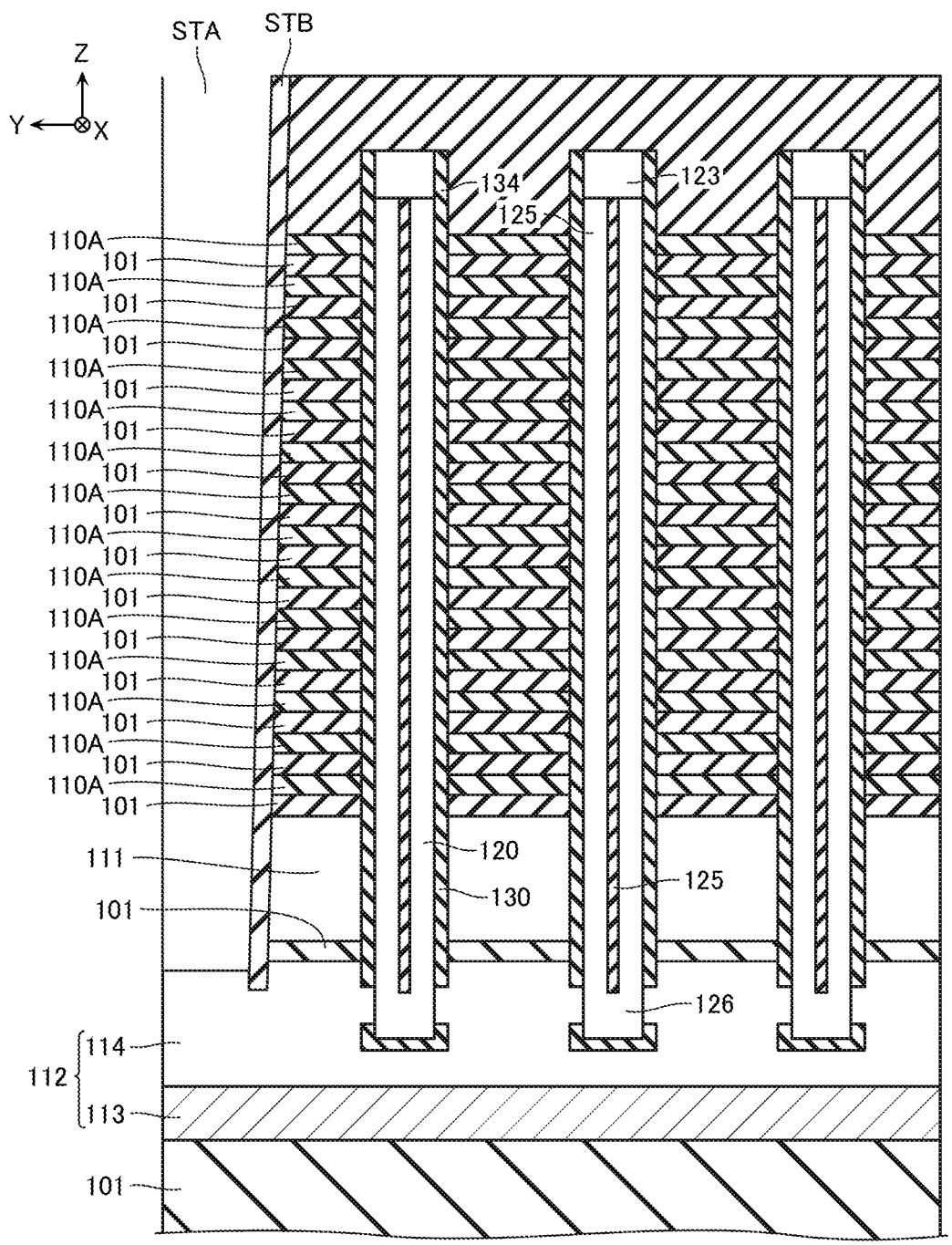
FIG. 17 is a schematic cross-sectional view illustrating the manufacturing method.

Next, for example, as illustrated in FIG. 17, the conducting layer 114 is formed. For example, by a method such as epitaxial growth, a silicon layer containing impurities such as phosphorus is formed on the upper surface of the semiconductor layer 114A and the lower surface of the semiconductor layer 114E.

Figure 18:
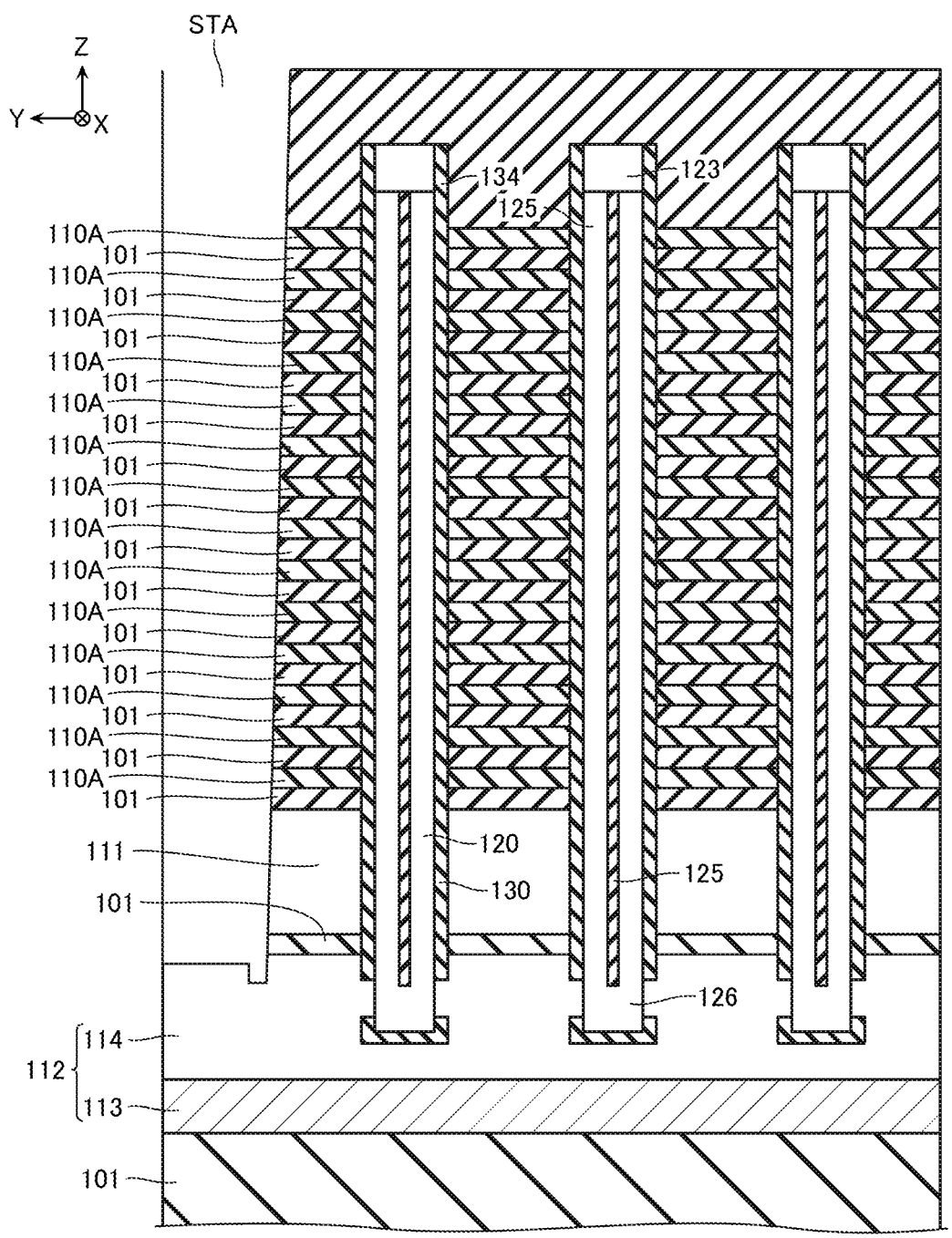
FIG. 18 is a schematic cross-sectional view illustrating the manufacturing method.

Next, for example, as illustrated in FIG. 18, the protective coat STB is removed. This process is performed by a method such as wet etching.

Figure 19:
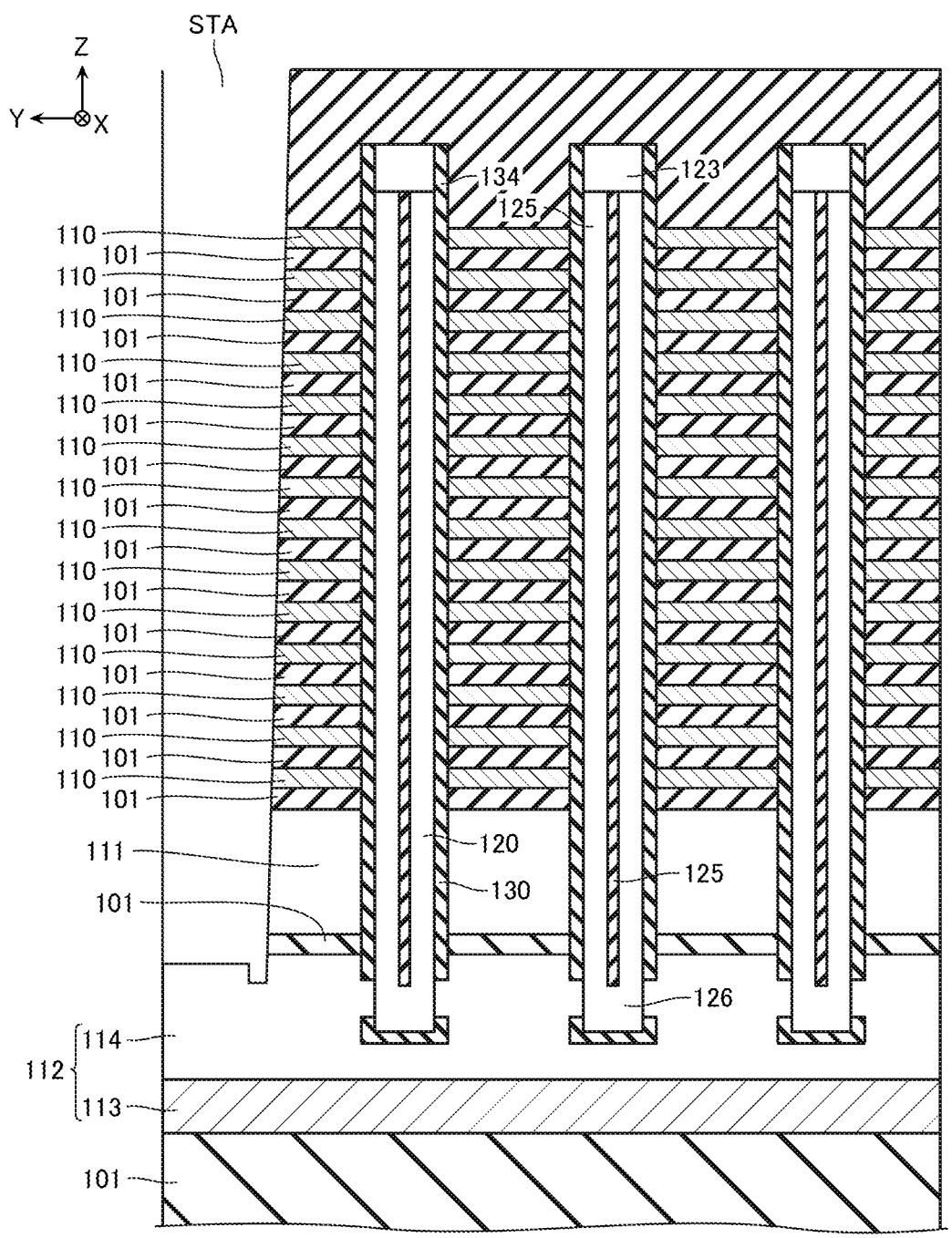
FIG. 19 is a schematic cross-sectional view illustrating the manufacturing method.

Next, for example, as illustrated in FIG. 19, the conducting layers 110 are formed. For example, the sacrificial layers 110A are removed by a method such as wet etching, and layers of tungsten or the like are formed by a method such as CVD.

Then, the inter-block structure insulating layer ST (FIG. 4) is formed inside the opening STA by a method such as CVD, the inter-subblock insulating layer SHE (FIG. 4) is formed by a method such as RIE and CVD, and the contacts CH (FIG. 4) are formed by a method such as RIE and CVD. Thus, the structure described with reference to FIG. 4 and the like is formed.

Effects

In this embodiment, for example, as described with reference to FIG. 9, the gate insulating film 130, the semiconductor layers 123A, 122A, and 121A of silicon or the like, and the insulating layer 125 are formed inside the openings MH. The semiconductor layer 122A contains carbon (C), oxygen (0), nitrogen (N), or boron (B) as the dopant.

In this embodiment, for example, as described with reference to FIG. 11, the crystalline structures of the semiconductor layers 123A, 122A, and 121A are modified by the method such as a heat treatment.

The inventors conducted extensive studies and has found that the sizes of the crystal grains contained in the semiconductor layer 120 can be increased by this method. For example, it has found that, as described with reference to FIG. 4, the size W1 of the crystal grain contained in the semiconductor layer 120 can be increased to 100 nm or more by this method. Accordingly, an electric resistance value caused by a crystal grain boundary when the memory cell MC is an ON state can be reduced. An off-leakage current caused by the crystal grain boundary when the memory cell MC is an OFF state can be reduced.

Second Embodiment

Configuration

Next, a configuration of a semiconductor memory device according to the second embodiment will be described with reference to FIG. 20 to FIG. 22.

Figure 20:
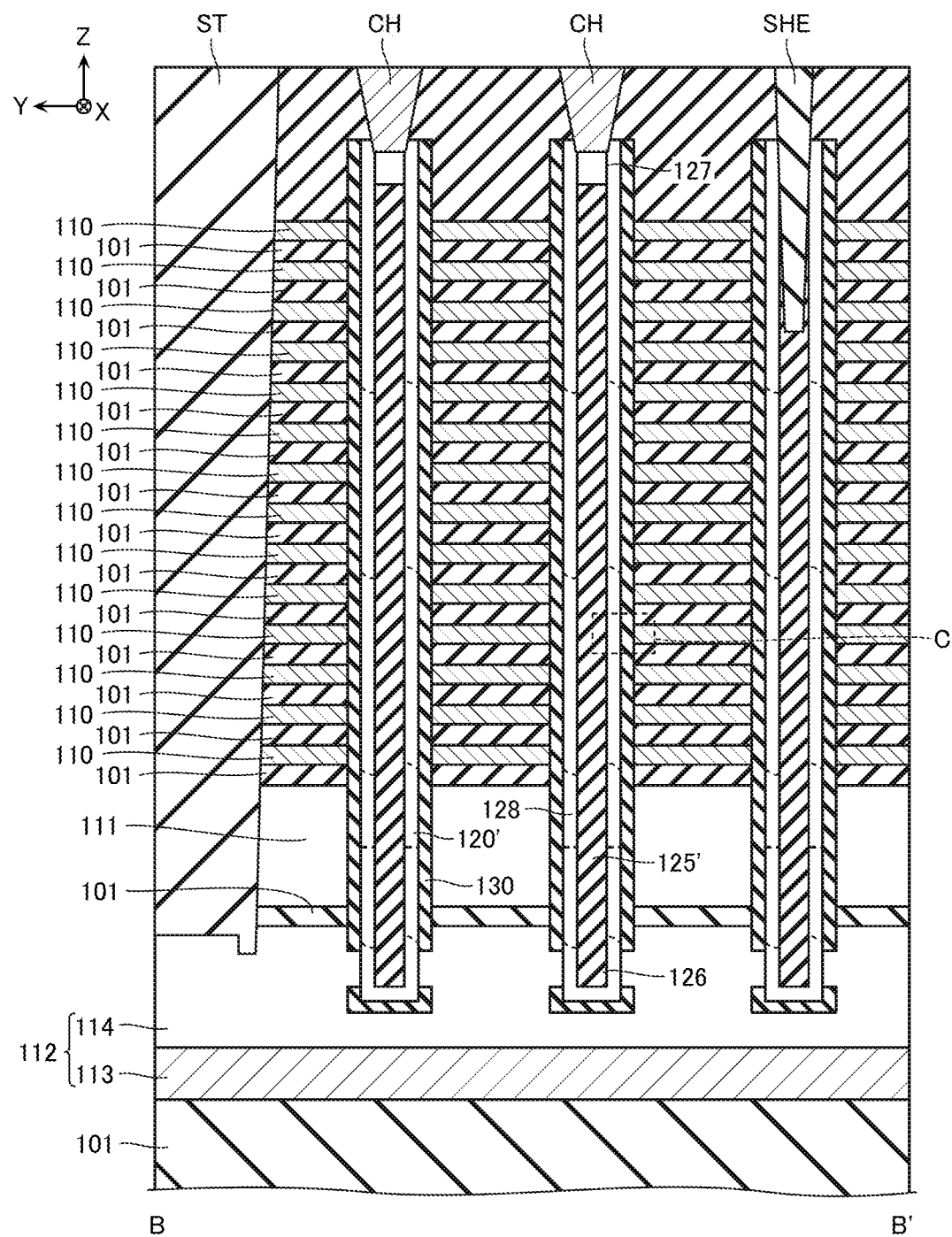
FIG. 20 is a schematic cross-sectional view illustrating a configuration of a semiconductor memory device according to a second embodiment.
Figure 21:
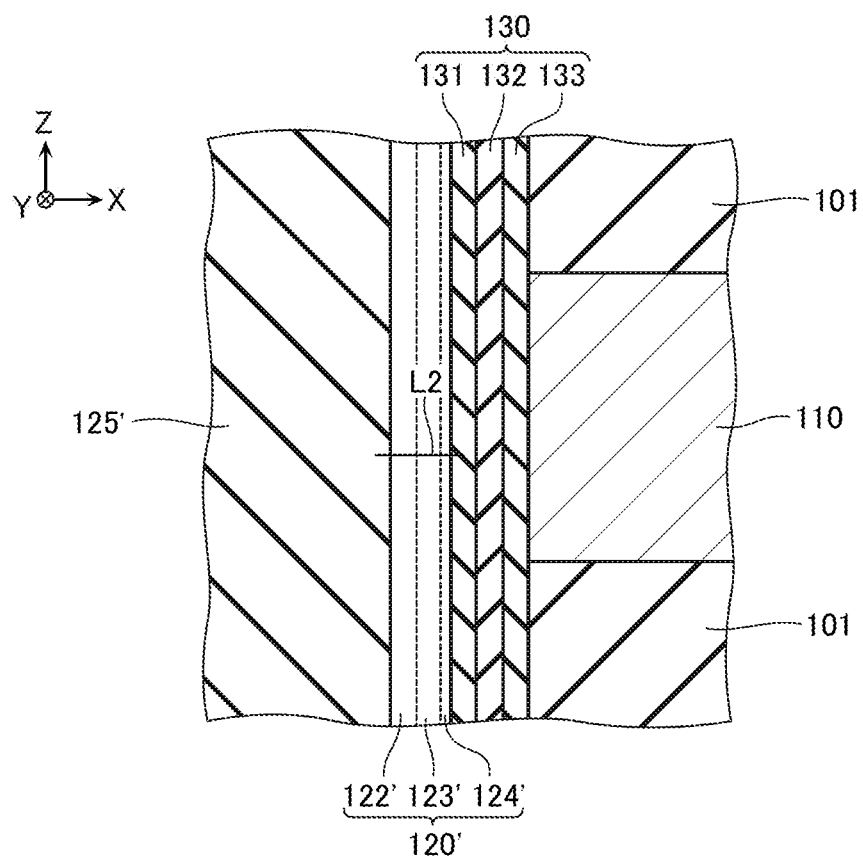
FIG. 21 is an enlarged view of a part indicated by C in FIG. 20.

FIG. 20 is a schematic cross-sectional view illustrating the configuration of the semiconductor memory device according to the embodiment. FIG. 21 is a schematic enlarged view of a part indicated by C in FIG. 20.

The semiconductor memory device according to the embodiment is configured basically similarly to the semiconductor memory device according to the first embodiment. However, a semiconductor layer 120' and an insulating layer 125' of the semiconductor memory device according to the embodiment have the configurations partially different from the configurations of the semiconductor layer 120 and the insulating layer 125 according to the first embodiment. FIG. 22 is a schematic graph illustrating a concentration distribution of a dopant obtained when an imaginary straight line L2 is set to a cross-sectional surface as illustrated in FIG. 21 and the concentration of the dopant is measured along the imaginary straight line L2. The imaginary straight line L2 is a straight line, for example, connecting between a part of the insulating layer 125' and a part of the gate insulating film 130. The straight line L2 extends in a direction intersecting with the Z-direction, for example, the X-direction or the Y-direction. The concentration distribution can be measured by, for example, irradiating the cross-sectional surface as illustrated in FIG. 21 with an electron beam and the like along the straight line L2, breaking a part of the semiconductor layer 120' along the electron beam, and analyzing a composition of the broken part.

Figure 22:
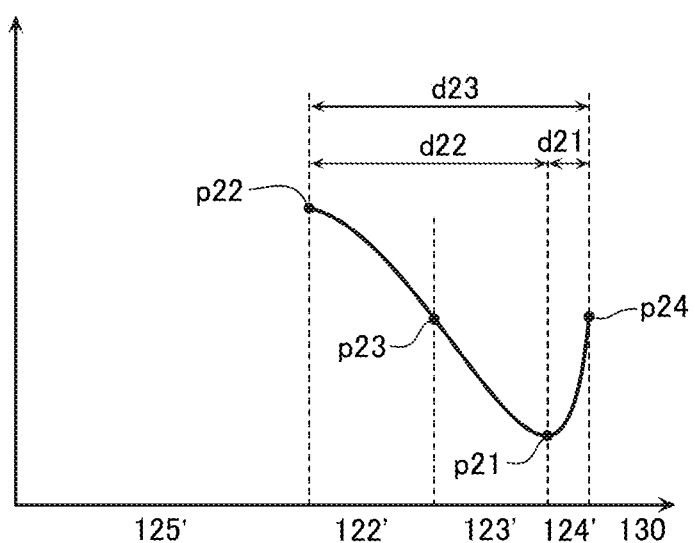
FIG. 22 is a schematic graph illustrating a concentration distribution of a dopant obtained when measuring the concentration of the dopant along an imaginary straight line L2 illustrated in FIG. 21.

FIG. 22 exemplifies a plurality of points p21 to p24 set on the imaginary straight line L2.

The point p21 indicates a point at which the concentration of the dopant has the minimum value. In the illustrated example, a distance d21 from the point p21 to an end portion of the semiconductor layer 120' on the gate insulating film 130 side is smaller than a distance d22 from the point p21 to an end portion of the semiconductor layer 120' on the insulating layer 125' side.

The point p22 indicates a point at which the concentration of the dopant has the maximum value in a region closer to the insulating layer 125' than the point p21. In the illustrated example, the concentration of the dopant monotonously increases from the point p21 to the point p22. In the illustrated example, a distance d23 from the point p22 to the end portion of the semiconductor layer 120' on the gate insulating film 130 side is greater than a distance from the point p22 to the end portion of the semiconductor layer 120' on the insulating layer 125' side. For example, in the illustrated example, the point p22 is positioned at the end portion of the semiconductor layer 120' on the insulating layer 125' side.

The point p23 indicates a point among the points between the point p21 and the point p22 at which the concentration of the dopant has an intermediate value between the concentration at the point p21 and the concentration at the point p22. When there are a plurality of points between the point p21 and the point p22 at which the concentration of the dopant has the intermediate value between the concentration at the point p21 and the concentration at the point p22, for example, a point closest to the point p22 among the plurality of points may be specified as the point p23.

The point p24 indicates a point at which the concentration of the dopant has the maximum value in a region closer to the gate insulating film 130 than the point p21. In the illustrated example, the concentration of the dopant monotonously increases from the point p21 to the point p24. In the illustrated example, the point p24 is positioned at the end portion of the semiconductor layer 120' on the gate insulating film 130 side.

In the illustrated example, the semiconductor layer 120' is illustrated by dividing into three regions of a region 122', a region 123', and a region 124' from the insulating layer 125' side to the gate insulating film 130 side. The region 122' is a region from the end portion of the semiconductor layer 120' on the insulating layer 125' side to the point p23. The region 123' is a region from the point p23 to the point p21. The region 124' is a region from the point p21 to the end portion of the semiconductor layer 120' on the gate insulating film 130 side.

In the illustrated example, the concentration of the dopant in the region 122' has an average value greater than average values of the concentration of the dopant in the regions 123' and 124'. The average values of the concentration of the dopant in the respective regions are calculated based on, for example, the concentration distribution of the dopant obtained along the straight line L2.

Manufacturing Method

Next, the method for manufacturing the semiconductor memory device according to the embodiment will be described with reference to FIG. 23 to FIG. 28. FIG. 23 to FIG. 28 are schematic cross-sectional views for describing the manufacturing method.

In the manufacturing method, for example, the processes described with reference to FIG. 7 to FIG. 12 in the method for manufacturing the semiconductor memory device according to the first embodiment are performed.

Figure 23:
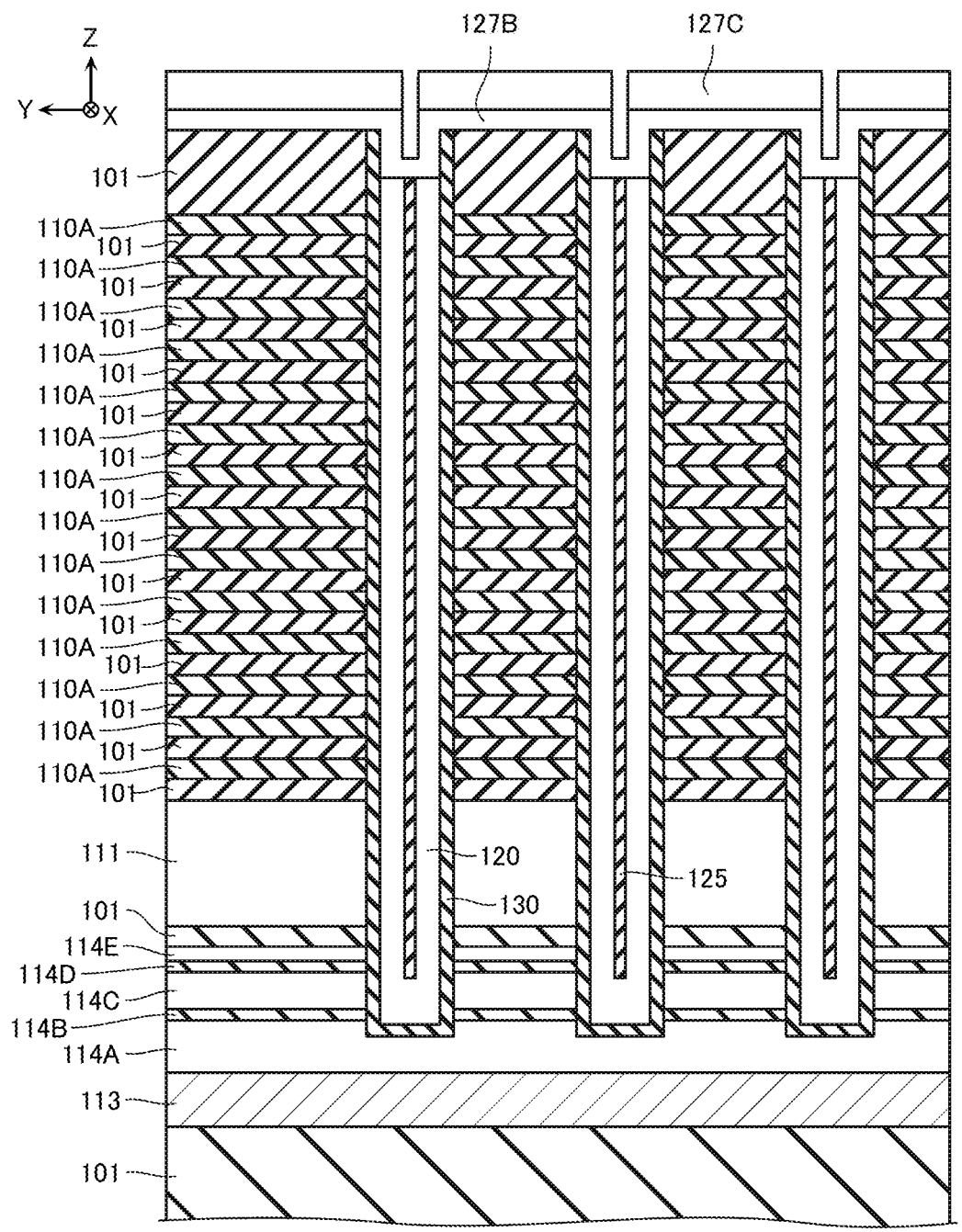
FIG. 23 is a schematic cross-sectional view illustrating a method for manufacturing the semiconductor memory device according to the second embodiment.

Next, for example, as illustrated in FIG. 23, a semiconductor layer 127B of silicon or the like is formed at the upper ends of the semiconductor layer 120 and the insulating layer 125 and on the upper surface of the insulating layer 101 positioned in the uppermost layer. The semiconductor layer 127B is formed to be thin to the extent that the openings MH are not embedded. This process is performed by a method such as CVD.

Next, for example, as illustrated in FIG. 23, cover films 127C are formed on the parts of the semiconductor layer 127B covering the insulating layer 101 positioned in the uppermost layer. This process is performed by a method such as crystal growth.

Figure 24:
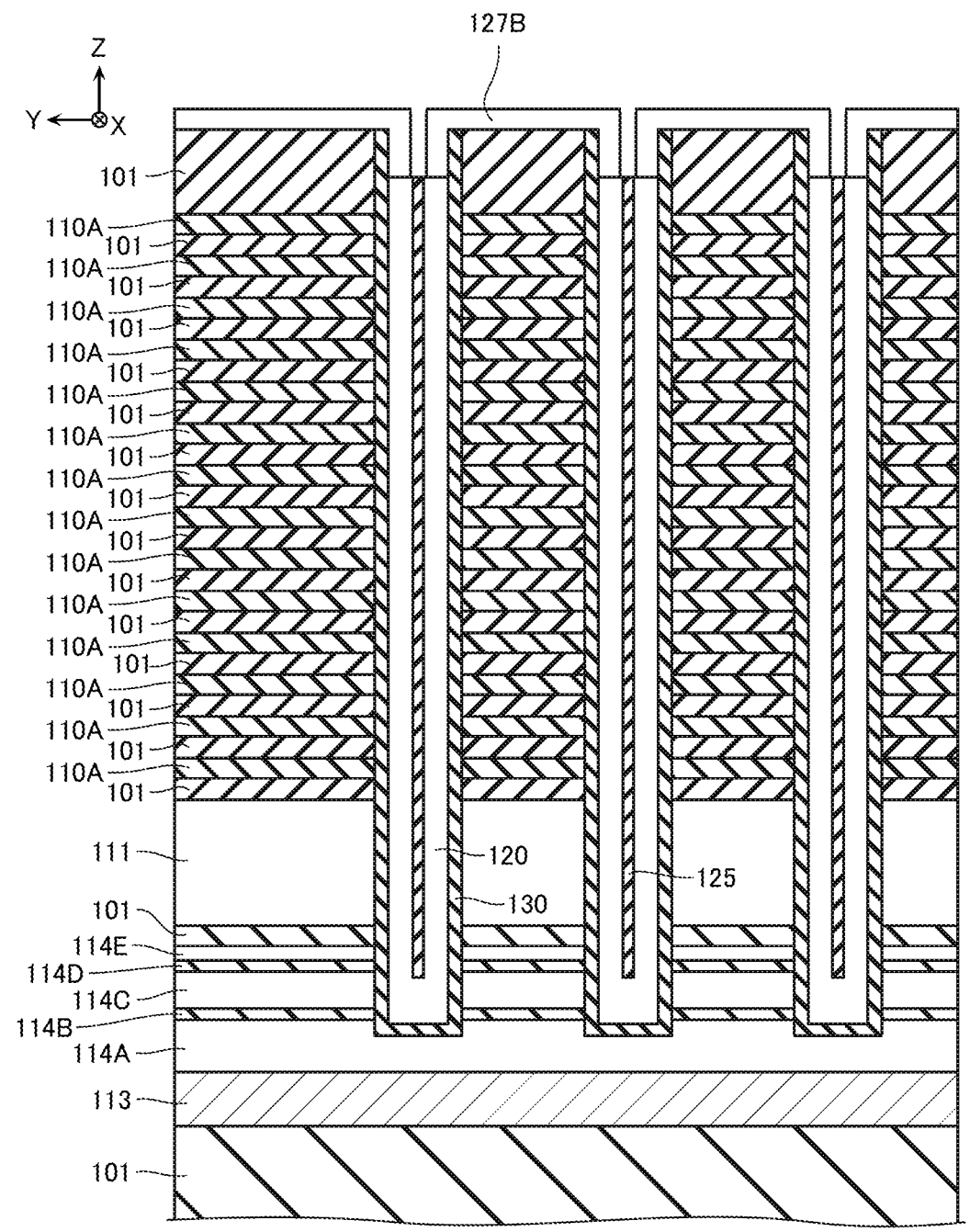
FIG. 24 is a schematic cross-sectional view illustrating the manufacturing method.

Next, for example, as illustrated in FIG. 24, the parts of the semiconductor layer 127B covering the upper ends of the insulating layer 125 are removed. This process is performed by a method such as RIE.

Figure 25:
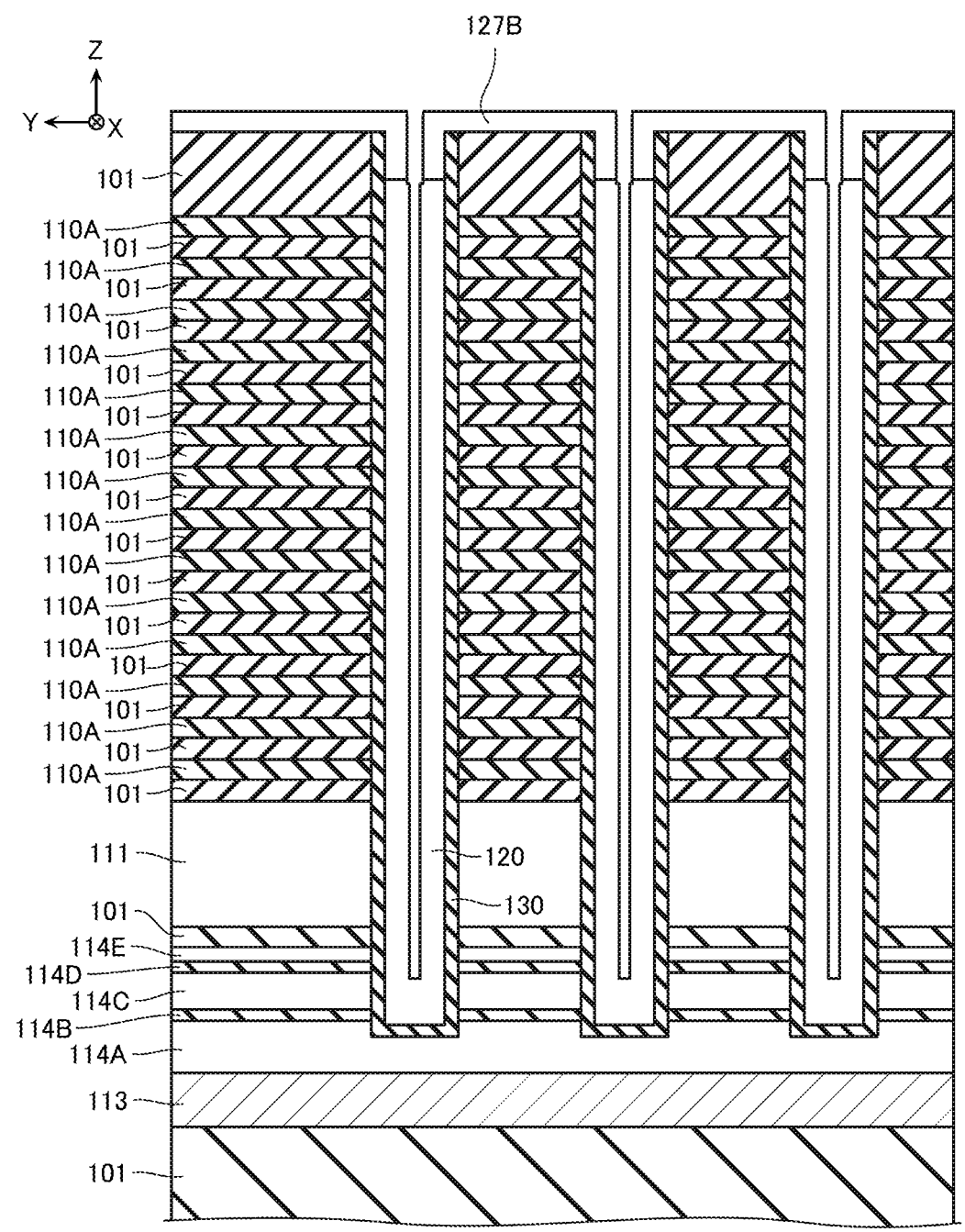
FIG. 25 is a schematic cross-sectional view illustrating the manufacturing method.

Next, for example, as illustrated in FIG. 25, the insulating layer 125 is removed. This process is performed by a method such as wet etching.

Figure 26:
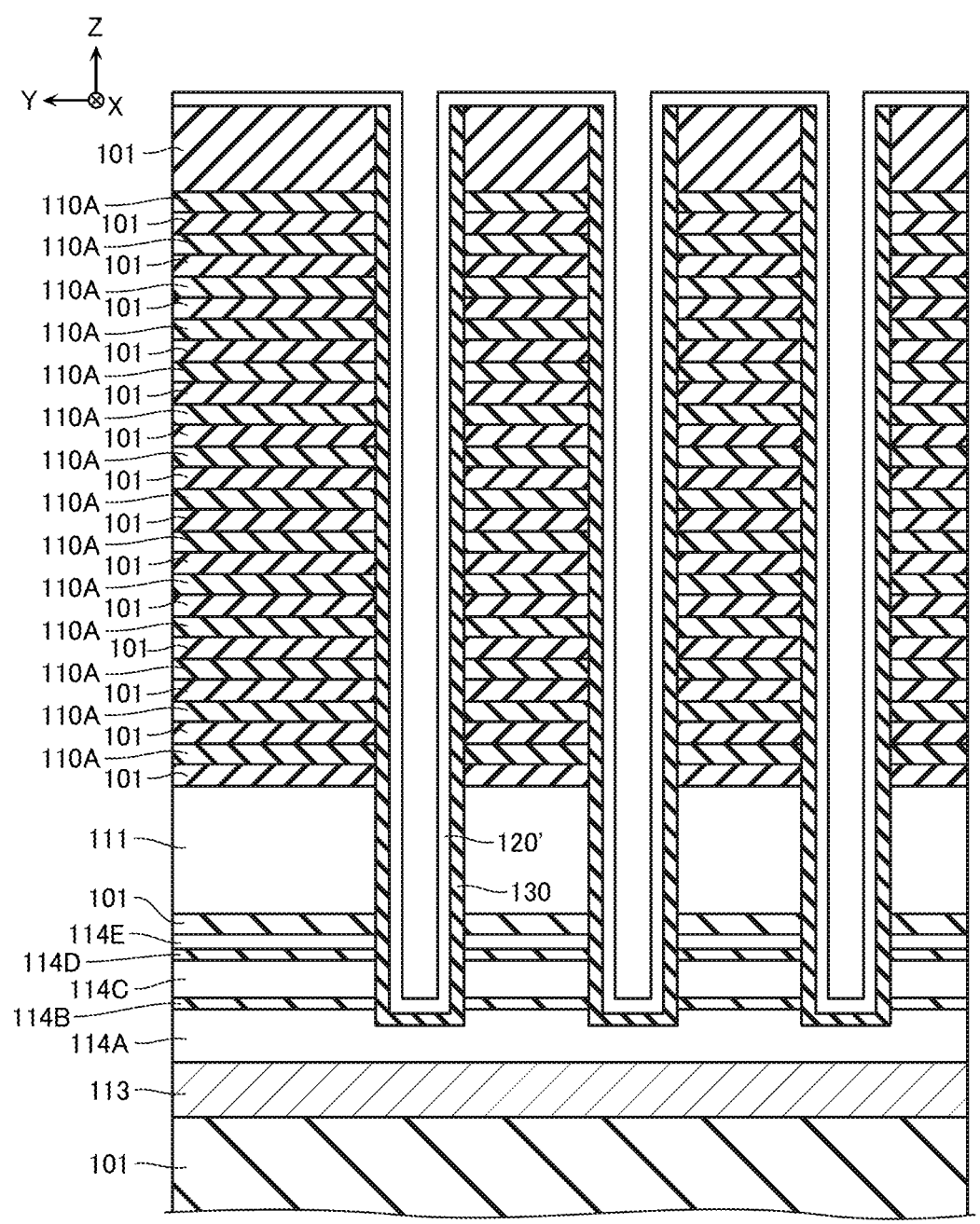
FIG. 26 is a schematic cross-sectional view illustrating the manufacturing method.

Next, for example, as illustrated in FIG. 26, the semiconductor layer 120 and a part of the semiconductor layer 127B are removed, and these configurations are thinned. This process is performed by a method such as wet etching.

Next, for example, as illustrated in FIG. 26, the semiconductor layer 127B is crystallized. Thus, the semiconductor layer 120' is formed.

Figure 27:
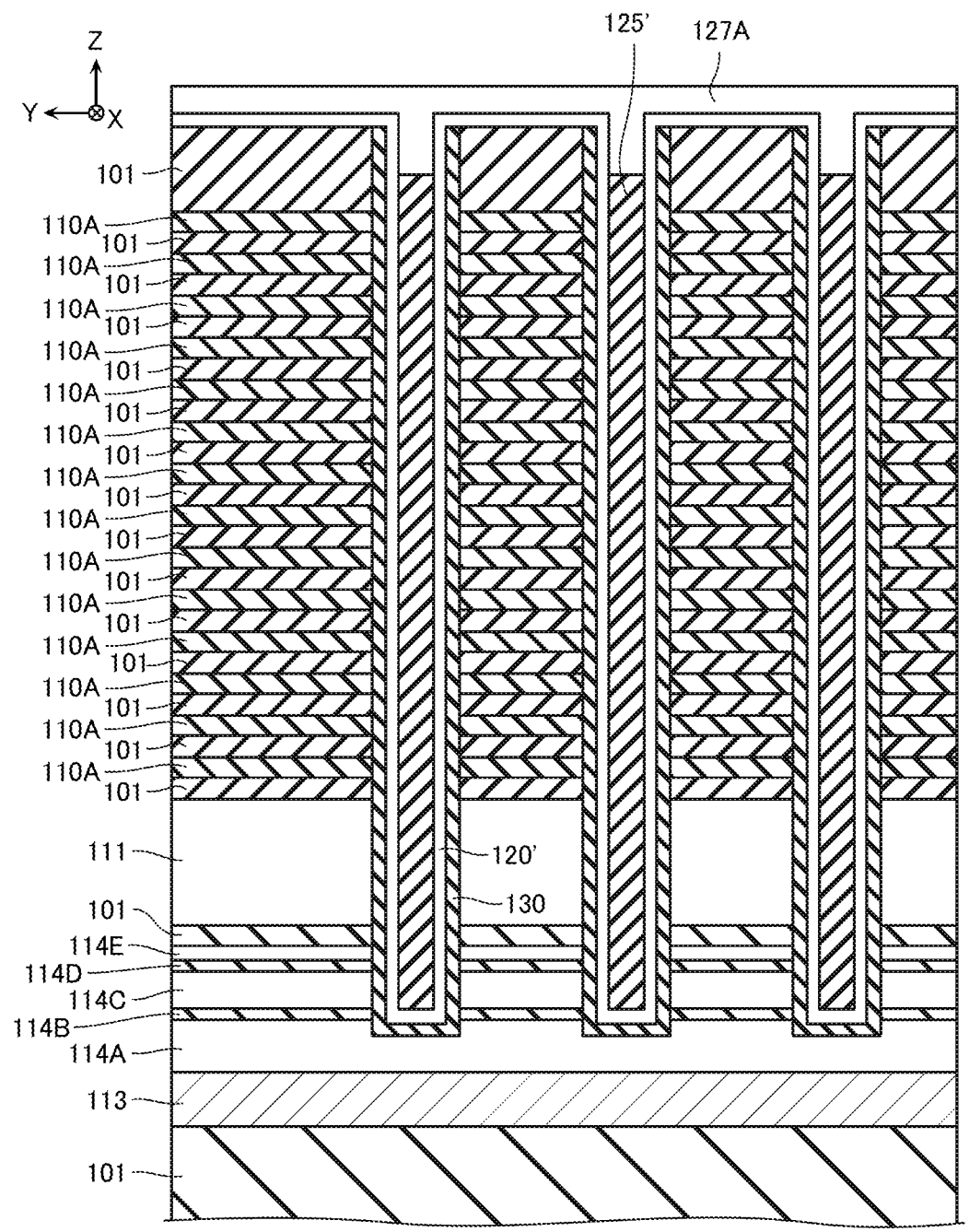
FIG. 27 is a schematic cross-sectional view illustrating the manufacturing method.

Next, for example, as illustrated in FIG. 27, the insulating layer 125' is formed inside the openings MH. This process is performed by a method such as CVD.

Next, for example, as illustrated in FIG. 27, a semiconductor layer 127A of silicon or the like containing impurities such as phosphorus is formed on the upper surface of the insulating layer 125', the inner peripheral surface of the semiconductor layer 120', and the upper surface of the semiconductor layer 120'. This process is performed by a method such as CVD.

Figure 28:
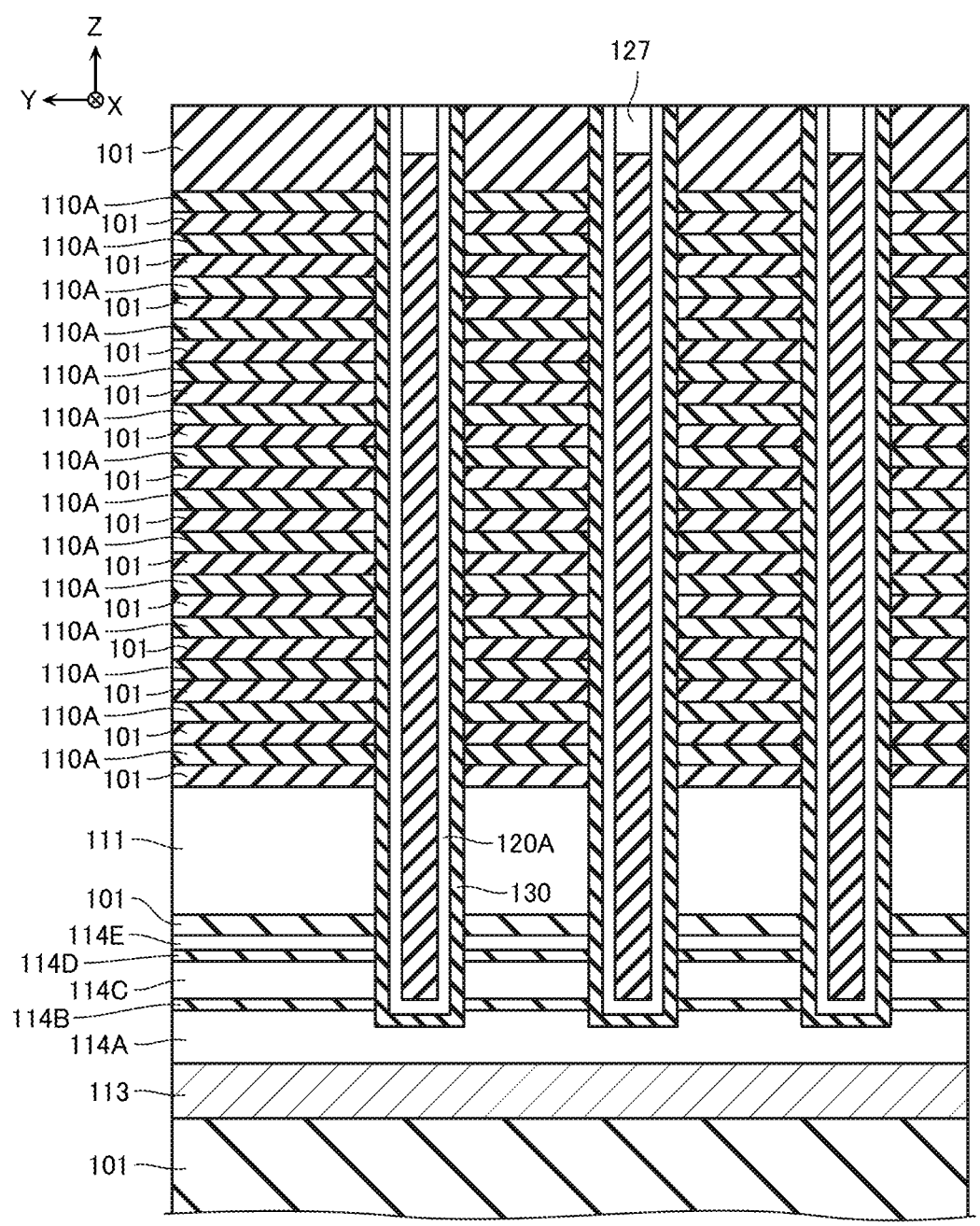
FIG. 28 is a schematic cross-sectional view illustrating the manufacturing method.

Next, for example, as illustrated in FIG. 28, for the semiconductor layer 120' and the semiconductor layer 127A, the parts disposed to the upper surface of the insulating layer 101 positioned in the uppermost layer are removed. Thus, the impurity regions 127 of the semiconductor layer 120' are formed. This process is performed by a method such as RIE.

Next, for example, the processes following the processes described with reference to FIG. 15 in the method for manufacturing the semiconductor memory device according to the first embodiment are performed.

Effects

For example, in the process of modifying the crystalline structures of the semiconductor layers 123A, 122A, and 121A as described with reference to FIG. 11, the film thicknesses of the semiconductor layers 123A, 122A, and 121A are preferably large.

Meanwhile, to decrease the off-leakage current in a read operation and the like of the semiconductor memory device, the film thicknesses of the semiconductor layers 120 and 120' are preferably small.

Therefore, in this embodiment, the crystalline structures are modified in a state where the film thicknesses of the semiconductor layers 123A, 122A, and 121A are relatively large, and subsequently, for example, as described with reference to FIG. 26, the semiconductor layer 120 is thinned. Accordingly, the semiconductor layer 120' in which the crystalline structure of the semiconductor layer is appropriately modified and the off-leakage current is decreased is manufacturable.

Other Embodiments

The semiconductor memory devices according to the embodiments have been described above. However, the above descriptions are merely examples, and the above-described configuration, method, and the like are adjustable as necessary.

For example, in the process described with reference to FIG. 9, the semiconductor layers 123A, 122A, and 121A of silicon or the like are sequentially formed. However, for example, these semiconductor films may be batch-formed by a method such as CVD. This process may be performed by controlling a flow rate of a gas containing a dopant in the formation of the semiconductor film by the CVD and the like.

For example, in the process described with reference to FIG. 7, the plurality of insulating layers 101 and the plurality of sacrificial layers 110A are alternately formed. In the process described with reference to FIG. 19, the plurality of sacrificial layers 110A are removed to form the conducting layers 110. However, for example, in the process described with reference to FIG. 7, a plurality of conducting layers 110 may be formed instead of the plurality of sacrificial layers 110A. The process described with reference to FIG. 19 may be omitted.

Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a substrate;
a plurality of first conducting layers arranged in a first direction that intersects with a surface of the substrate;
a first semiconductor layer extending in the first direction, the first semiconductor layer being opposed to the plurality of first conducting layers in a second direction that intersects with the first direction and containing a dopant; and
memory cells disposed at intersecting portions between the first conducting layers and the first semiconductor layer, wherein
the first semiconductor layer contains crystal grains of 100 nm or more in size,
when a concentration of the dopant in the first semiconductor layer is measured along an imaginary straight line that extends in the second direction,
a point on the imaginary straight line at which the concentration of the dopant has a maximum value is defined as a first point,
a point on the imaginary straight line at which the concentration of the dopant has a minimum value in a region closer to the first conducting layer than the first point is defined as a second point, and
a point on the imaginary straight line at which the concentration of the dopant has a minimum value in a region farther from the first conducting layer than the first point is defined as a third point, wherein
a distance from the second point to an end portion of the first semiconductor layer on the first conducting layer side is smaller than a distance from the second point to an end portion of the first semiconductor layer on an opposite side of the first conducting layer, and
a distance from the third point to the end portion of the first semiconductor layer on the first conducting layer side is greater than a distance from the third point to the end portion of the first semiconductor layer on the opposite side of the first conducting layer.

2. The semiconductor memory device according to claim 1, wherein
a distance from the first point to the end portion of the first semiconductor layer on the first conducting layer side is greater than a distance from the first point to the end portion of the first semiconductor layer on the opposite side of the first conducting layer.

3. The semiconductor memory device according to claim 1, wherein
when a point on the imaginary straight line positioned between the first point and the second point is defined as a fourth point, and the concentration of the dopant has an intermediate value between the maximum value corresponding to the first point and the minimum value corresponding to the second point at the fourth point,
a point on the imaginary straight line positioned between the first point and the third point is defined as a fifth point, and the concentration of the dopant has an intermediate value between the maximum value corresponding to the first point and the minimum value corresponding to the third point at the fifth point,
a region of the first semiconductor layer closer to the first conducting layer than the fourth point is defined as a first region,
a region of the first semiconductor layer from the fourth point to the fifth point is defined as a second region, and
a region of the first semiconductor layer farther from the first conducting layer than the fifth point is defined as a third region,
an average value of the concentration of the dopant in the second region is greater than an average value of the concentration of the dopant in the first region, and
the average value of the concentration of the dopant in the second region is greater than an average value of the concentration of the dopant in the third region.

4. The semiconductor memory device according to claim 1, wherein the third point is positioned at the end portion of the first semiconductor layer on the opposite side of the first conducting layer.

5. The semiconductor memory device according to claim 1, wherein
the dopant is carbon (C), oxygen (O), nitrogen (N), or boron (B).

* * * * *